(12) United States Patent
Kim et al.

(10) Patent No.: US 10,319,711 B2
(45) Date of Patent: Jun. 11, 2019

(54) ELECTROSTATIC PROTECTION DIODE AND ORGANIC LIGHT EMITTING DISPLAY DEVICE INCLUDING ELECTROSTATIC PROTECTION STRUCTURE

(71) Applicant: Samsung Display Co., Ltd., Yongin-si, Gyeonggi-do (KR)

(72) Inventors: Jung-Hyun Kim, Suwon-si (KR); Yeon-Hong Kim, Hwaseong-si (KR); Ki-Wan Ahn, Seoul (KR)

(73) Assignee: Samsung Display Co., Ltd., Yongin-si (KR)

(*) Notice: Subject to any disclaimer, the term of this patent is extended or adjusted under 35 U.S.C. 154(b) by 8 days.

(21) Appl. No.: 15/638,961

(22) Filed: Jun. 30, 2017

(65) Prior Publication Data

US 2018/0076192 A1 Mar. 15, 2018

(30) Foreign Application Priority Data

Sep. 13, 2016 (KR) .................. 10-2016-0118010

(51) Int. Cl.
*H01L 27/02* (2006.01)
*H01L 27/32* (2006.01)
*H01L 27/12* (2006.01)

(52) U.S. Cl.
CPC ...... *H01L 27/0248* (2013.01); *H01L 27/0266* (2013.01); *H01L 27/124* (2013.01); *H01L 27/3225* (2013.01); *H01L 27/3276* (2013.01)

(58) Field of Classification Search
CPC .................. H01L 27/0248; H01L 27/0266
See application file for complete search history.

(56) References Cited

U.S. PATENT DOCUMENTS

| 6,281,553 B1* | 8/2001 | Sasaki | H01L 27/0266 257/356 |
| 6,365,941 B1* | 4/2002 | Rhee | H01L 27/0255 257/328 |
| 2010/0038706 A1* | 2/2010 | Kitajima | H01L 27/0259 257/328 |
| 2013/0001578 A1* | 1/2013 | Song | H01L 51/5275 257/71 |
| 2018/0033979 A1* | 2/2018 | Jang | H01L 51/0097 |

* cited by examiner

*Primary Examiner* — Lex H Malsawma
*Assistant Examiner* — Xia L Cross
(74) *Attorney, Agent, or Firm* — Lewis Roca Rothgerber Christie LLP

(57) ABSTRACT

An organic light emitting display device includes a substrate including a pixel region and a peripheral region, a first wiring, a second wiring, a third wiring, and an electrostatic protection structure including electrostatic protection diodes coupled to the first, second, and third wirings. The electrostatic protection diodes each include an active pattern, a gate electrode pattern, and a connection pattern. The active pattern is at the peripheral region of the substrate, and has a first region, a second region spaced apart from the first region, and a third region between the first and second regions. The gate electrode pattern is at the third region on the active pattern. The connection pattern is coupled to the gate electrode pattern and the active pattern and is on the gate electrode pattern, and overlaps a portion of the first region of the active pattern and a portion of the third region.

17 Claims, 16 Drawing Sheets

ELECTROSTATIC PROTECTION DIODE AND ORGANIC LIGHT EMITTING DISPLAY DEVICE INCLUDING ELECTROSTATIC PROTECTION STRUCTURE

CROSS-REFERENCE TO RELATED APPLICATION

This application claims priority to and the benefit of Korean Patent Application No. 10-2016-0118010, filed on Sep. 13, 2016 in the Korean Intellectual Property Office (KIPO), the entire content of which is incorporated herein by reference.

BACKGROUND

1. Field

Example embodiments of the present disclosure relate generally to electrostatic protection diodes. For example, embodiments of the present disclosure relate to display devices including the electrostatic protection diodes.

2. Description of the Related Art

A flat panel display (FPD) device is widely used as a display device of an electronic device because the FPD device is lightweight and thin compared to a cathode-ray tube (CRT) display device. Non-limiting examples of the FPD device include a liquid crystal display (LCD) device and an organic light emitting display (OLED) device. Compared to the LCD device, the OLED device has many features such as a higher luminance and a wider viewing angle. In addition, the OLED device can be made thinner because the OLED device does not require a backlight unit. In the OLED device, electrons and holes are injected into an organic thin layer through a cathode and an anode, and then recombined in the organic thin layer to generate excitons, thereby a light of a certain wavelength (or wavelength range) can be emitted.

Static electricity generated in a manufacturing process of the OLED device may penetrate through wirings included in the OLED device into a pixel region that includes a plurality of pixel structures. In this case, the pixel structures may be damaged by the static electricity, and then the OLED device may be deteriorated or damaged.

SUMMARY

Some example embodiments provide an electrostatic protection diode.

Some example embodiments provide an organic light emitting display device including an electrostatic protection diode.

According to some example embodiments, an electrostatic protection diode includes an active pattern, a gate electrode pattern, and a connection pattern. The active pattern has a first region, a second region that is spaced apart from the first region, and a third region located between the first and second regions. The gate electrode pattern is disposed in the third region on the active pattern. The connection pattern is disposed on the gate electrode pattern, and overlaps a portion of the first region of the active pattern and a portion of the third region of the active pattern. The connection pattern is electrically coupled to the gate electrode pattern and the active pattern.

In example embodiments, the electrostatic protection diode may further include a gate insulation pattern and an insulating interlayer pattern. The gate insulation pattern may cover the active pattern. The insulating interlayer pattern may be disposed on the gate insulation pattern and the gate electrode pattern, and may cover the gate electrode pattern.

In example embodiments, the connection pattern may be in concurrent (e.g., simultaneous) contact with a portion of an upper surface of the gate electrode pattern, a portion of a side surface of the gate electrode pattern, and a portion of an upper surface of the active pattern.

According to some example embodiments, an organic light emitting display (OLED) device includes a substrate, a first wiring, a second wiring, a third wiring, and an electrostatic protection structure. The substrate includes a pixel region where a plurality of pixel structures are disposed and a peripheral region where a plurality of wirings are disposed. The wirings are electrically coupled to the pixel structures, and the peripheral region surrounds the pixel region. The first wiring is disposed in the peripheral region on the substrate, and has a first width. The second wiring is disposed on the first wiring, and is intersected with the first wiring. The second wiring has a second width that is less than the first width. The third wiring is spaced apart from the first wiring, and has a third width that is greater than the second width. The electrostatic protection structure has electrostatic protection diodes, and the electrostatic protection diodes are electrically coupled to the first, second, and third wirings. The electrostatic protection diodes each include an active pattern, a gate electrode pattern, and a connection pattern. The active pattern is disposed in the peripheral region on the substrate, and has a first region, a second region that is spaced apart from the first region, and a third region located between the first and second regions. The gate electrode pattern is disposed in the third region on the active pattern. The connection pattern is disposed on the gate electrode pattern, and overlaps a portion of the first region of the active pattern and a portion of the third region. The connection pattern is electrically coupled to the gate electrode pattern and the active pattern.

In example embodiments, the active pattern may extend in a first direction that is parallel (e.g., substantially parallel) to an upper surface of the substrate, and may include a first distal end portion and a second distal end portion. The first distal end portion of the active pattern nay overlap a portion of the first wiring, and The second distal portion of the active pattern may overlap a portion of the third wiring. The second distal portion may be opposite to the first distal end portion.

In example embodiments, the first wiring and the third wiring may extend in a second direction that is perpendicular (e.g., substantially perpendicular) to the first direction. The second wiring may be spaced apart from the active pattern, and may extend in the first direction.

In example embodiments, the gate electrode pattern includes first, second, third, fourth, and fifth gate electrode patterns that are disposed on the active pattern. The first, second, third, fourth, and fifth gate electrode patterns may overlap the active pattern, and may be spaced apart from each other.

In example embodiments, the first gate electrode pattern may be disposed adjacent to the first wiring, and fifth gate electrode pattern may be disposed adjacent to the third wiring. The second, third, and fourth gate electrode patterns may be sequentially disposed between first and fifth gate electrode patterns.

In example embodiments, the connection pattern may include first, second, third, and fourth connection patterns that are disposed on the first, second, fourth, and fifth gate electrode patterns. The first, second, third, and fourth connection patterns may overlap the first, second, fourth, and fifth gate electrode patterns, respectively, and may be spaced apart from each other.

In example embodiments, the first connection pattern may overlap a portion of the first wiring, a portion of the active pattern, and a portion of the first gate electrode pattern, and the fourth connection pattern may overlap a portion of the third wiring, a portion of the active pattern, and a portion of the fifth gate electrode pattern. The second connection pattern may overlap a portion of the active pattern and a portion of the second gate electrode pattern, and the third connection pattern may overlap a portion of the active pattern and a portion of the fourth gate electrode pattern.

In example embodiments, the second wiring may include a first extension extending in the first direction and a second extension protruded in the second direction from the first extension.

In example embodiments, the second extension may be located at the same level with the first, second, third, and fourth connection patterns, and may be interposed between the second and third connection patterns.

In example embodiments, the second extension may overlap a portion of the third gate electrode pattern and a portion of the active pattern.

In example embodiments, the first wiring may be a high power supply voltage wiring, and the third wiring may be a lower power supply voltage wiring. The second wiring may be a scan signal wiring, a data signal wiring, an initialization signal wiring, or an emission signal wiring.

In example embodiments, the first thickness may be the same or substantially the same as the third thickness.

In example embodiments, the first wiring, the third wiring, the gate electrode pattern may be concurrently (e.g., simultaneously) formed using the same or substantially the same material, and the second wiring and the connection pattern may be concurrently (e.g., simultaneously) formed using the same material.

In example embodiments, each of the pixel structures may include a semiconductor element disposed in the pixel region on the substrate, a lower electrode disposed on the semiconductor element, a light emitting layer disposed on the lower electrode, and an upper electrode disposed on the light emitting layer.

In example embodiments, the semiconductor element may include an active layer disposed in the pixel region on the substrate, a gate insulation layer covering the active layer, a gate electrode disposed on the gate insulation layer, an insulating interlayer covering the gate electrode, and source and drain electrodes disposed on the insulating interlayer.

In example embodiments, the OLED device may further include a gate insulation pattern and an insulating interlayer pattern. The gate insulation pattern may cover the active pattern. The insulating interlayer pattern may be disposed on the gate insulation layer and the gate electrode pattern, and may cover the gate electrode pattern.

In example embodiments, the active layer and the active pattern may be concurrently (e.g., simultaneously) formed using the same or substantially the same material, and the gate insulation layer and the gate insulation pattern may be concurrently (e.g., simultaneously) formed using the same or substantially the same material. The gate electrode and the gate electrode pattern may be concurrently (e.g., simultaneously) formed using the same or substantially the same material, and the insulating interlayer and the insulating interlayer pattern may be concurrently (e.g., simultaneously) formed using the same or substantially the same material. The source and drain electrodes and the connection pattern may be concurrently (e.g., simultaneously) formed using the same or substantially the same material.

As the electrostatic protection diode according to some example embodiments includes one contact hole, a width of the electrostatic protection diode may be relatively reduced.

In a manufacturing method of the electrostatic protection diode according to some example embodiments, since the number of the contact holes is relatively decreased, a manufacturing cost of the electrostatic protection diode may be reduced.

As each of the first, second, third, fourth, and fifth electrostatic protection diodes included in the electrostatic protection structure according to some example embodiments includes one contact hole, a width extending in the first direction of the electrostatic protection structure may be relatively reduced. For example, a space between the first wiring and the third wiring may be decreased. Thus, when the electrostatic protection structure having a relatively reduced width is disposed in the OLED device, the peripheral region of the OLED device may be relatively reduced because a space where the electrostatic protection structure having a relatively reduced width is disposed may be reduced. Also, the OLED device may have a relatively large number of electrostatic protection structures in a limited space, and since static electricity is readily escaped into the outside of the OLED device through the electrostatic protection structure, it may prevent the static electricity from penetrating into the pixel region (or it may reduce the penetration of static electricity into the pixel region). Accordingly, a deterioration of the OLED device may be relatively reduced.

In a method of manufacturing of the OLED device including the electrostatic protection structure according to some example embodiments, since the number of the contact holes is relatively decreased, a manufacturing cost of the OLED device including the electrostatic protection structure may be reduced.

BRIEF DESCRIPTION OF THE DRAWINGS

Example embodiments of the present disclosure can be understood in more detail from the following description taken in conjunction with the accompanying drawings, in which.

DETAILED DESCRIPTION

Hereinafter, embodiments of the present disclosure will be described in more detail with reference to the accompanying drawings.

Figure 1:
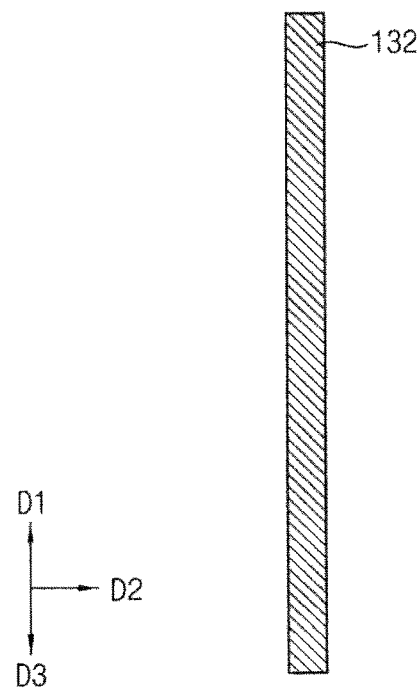
FIGS. 1-4 are layout diagrams illustrating an electrostatic protection diode in accordance with example embodiments.
Figure 2:
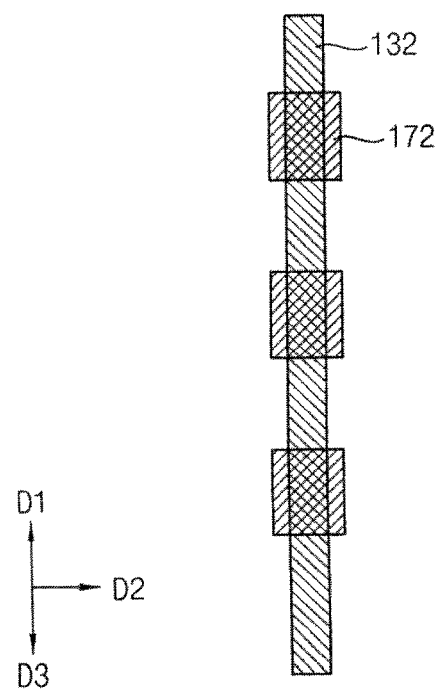
Figure 3:
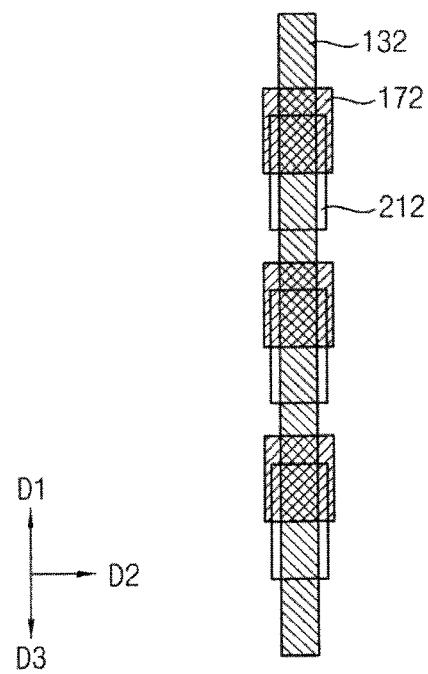
Figure 4:
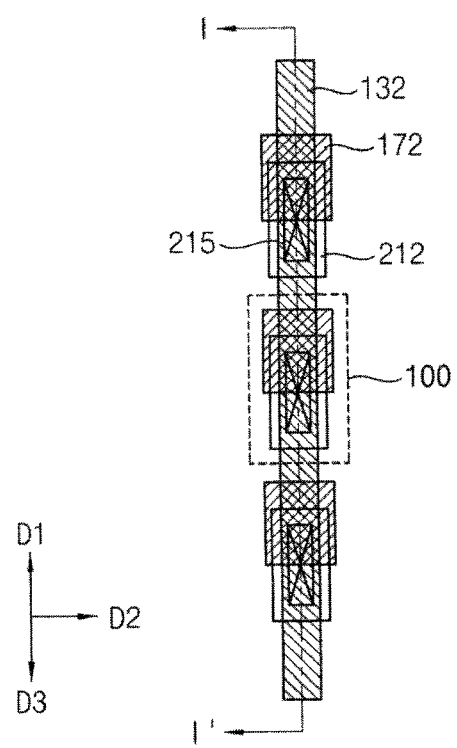
Figure 5:
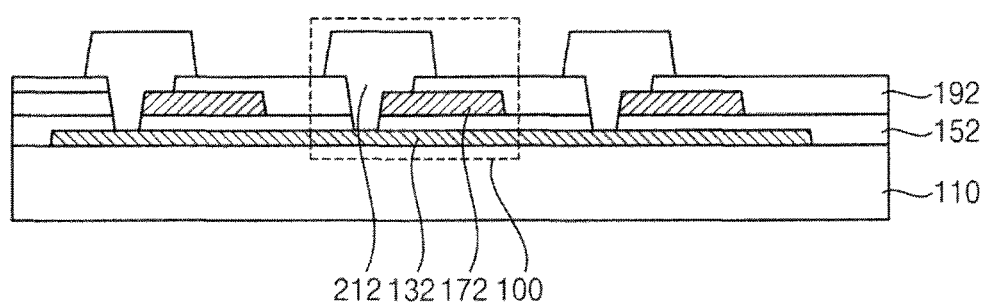
FIG. 5 is a cross-sectional view taken along a line I-I' of FIG. 4.

FIGS. 1-4 are layout diagrams illustrating an electrostatic protection diode in accordance with example embodiments, and FIG. 5 is a cross-sectional view taken along a line I-I' of FIG. 4.

Referring to FIGS. 1-5, an electrostatic protection diode 100 may include a substrate 110, an active pattern 132, a gate insulation pattern 152, a gate electrode pattern 172, an insulating interlayer pattern 192, and a connection pattern 212.

The substrate 110 including transparent or opaque materials may be provided. The substrate 110 may include any of a quartz substrate, a synthetic quartz substrate, a calcium fluoride substrate, a fluoride-doped quartz substrate, a sodalime glass substrate, a non-alkali glass substrate, etc. In some embodiments, the substrate 110 may include a flexible transparent material such as a flexible transparent resin substrate (e.g., a polyimide substrate).

The active pattern 132 may be disposed on the substrate 110. The active pattern 132 may include a first region, a second region, and a third region. The first region may be spaced apart from the second region, and the third region may be located between the first region and the second region. The active pattern 132 may include any of an oxide semiconductor, an inorganic semiconductor (e.g., amorphous silicon, polysilicon, etc.), an organic semiconductor, etc.

The gate insulation pattern 152 may be disposed on the substrate 110 and the active pattern 132. The gate insulation pattern 152 may cover the active pattern 132, and may be disposed on the entire (or substantially the entire) substrate 110. For example, the gate insulation pattern 152 may suitably or sufficiently cover the active pattern 132 on the substrate 110, and may have a substantially level surface without a step around the active pattern 132. In some embodiments, the gate insulation pattern 152 may cover the active pattern 132 on the substrate 110, and may be disposed to have a substantially uniform thickness along a profile of the active pattern 132. The gate insulation pattern 152 may include organic materials and/or inorganic materials. In example embodiments, the gate insulation pattern 152 may include inorganic materials such as a silicon compound, a metal oxide, etc. For example, the gate insulation pattern 152 may include silicon oxide (SiOx), silicon nitride (SiNx), silicon oxynitride (SiOxNy), silicon oxycarbide (SiOxCy), silicon carbon nitride (SiCxNy), aluminum oxide (AlOx), aluminum nitride (AlNx), tantalum oxide (TaOx), hafnium oxide (HfOx), zirconium oxide (ZrOx), titanium oxide (TiOx), etc.

The gate electrode pattern 172 may be disposed in the third region on the gate insulation pattern 152. The gate electrode pattern 172 may be disposed on a portion of the gate insulation pattern 152 under which the active pattern 132 is located. The gate electrode pattern 172 may include any of a metal, a metal alloy, metal nitride, conductive metal oxide, transparent conductive materials, etc. For example, the second gate electrode pattern 172 may include gold (Au), silver (Ag), aluminum (Al), platinum (Pt), nickel (Ni), titanium (Ti), palladium (Pd), magnesium (Mg), calcium (Ca), lithium (Li), chrome (Cr), tantalum (Ta), tungsten (W), copper (Cu), molybdenum (Mo), scandium (Sc), neodymium (Nd), iridium (Ir), an alloy of aluminum, aluminum nitride (AlNx), an alloy of silver, tungsten nitride (WNx), an alloy of copper, an alloy of molybdenum, titanium nitride (TiNx), chrome nitride (CrNx), tantalum nitride (TaNx), strontium ruthenium oxide (SRO), zinc oxide (ZnOx), indium tin oxide (ITO), stannum oxide (SnOx), indium oxide (InOx), gallium oxide (GaOx), indium zinc oxide (IZO), etc. These may be used alone or in a suitable combination thereof. In some embodiments, the gate electrode pattern 172 may have a multi-layered structure.

The insulating interlayer pattern 192 may be disposed on the gate insulation pattern 152 and the gate electrode pattern 172. The insulating interlayer pattern 192 may cover the gate electrode pattern 172, and may be disposed on the entire (or substantially the entire) gate insulation pattern 152. For example, the insulating interlayer pattern 192 may suitably or sufficiently cover the gate electrode pattern 172 on the gate insulation pattern 152, and may have a substantially level surface without a step around the gate electrode pattern 172. In some embodiments, the insulating interlayer pattern 192 may cover the gate electrode pattern 172 on the gate insulation pattern 152, and may be disposed to have a substantially uniform thickness along a profile of the gate electrode pattern 172. The insulating interlayer pattern 192 may include organic materials and/or inorganic materials. In example embodiments, the gate insulation pattern 152 may include inorganic materials such as a silicon compound, a metal oxide, etc.

The connection pattern 212 may be disposed on the insulating interlayer pattern 192. In example embodiments, the connection pattern 212 may overlap a portion of the first region of the active pattern 132 and a portion of the third region of the active pattern 132. In other words, the connection pattern 212 may overlap a portion of the gate electrode pattern 172 and a portion of the active pattern 132. The connection pattern 212 may be in direct contact with a portion of gate electrode pattern 172 and a portion of the active pattern 132 via a contact hole formed by removing a portion of the gate insulation pattern 152 and the insulating interlayer pattern 192 each. For example, the connection pattern 212 may be in simultaneous (or concurrent) contact with a portion of an upper surface of the gate electrode pattern 172, a portion of a side surface of the gate electrode pattern 172, and a portion of an upper surface of the active pattern 132. In addition, the connection pattern 212 may be electrically coupled to (e.g., electrically connected to) the gate electrode pattern 172 and the active pattern 132. The connection pattern 212 may include a metal, a metal nitride, a conductive metal oxide, and/or transparent conductive materials, etc. These may be used alone or in a suitable combination thereof. In some example embodiments, the connection pattern 212 may have a multi-layered structure.

For example, an existing electrostatic protection diode may have first and second contact holes. The first contact hole may be formed in a third region of an active pattern by removing a portion of an insulating interlayer pattern, and may expose a portion of a gate electrode pattern. In addition, the second contact hole may be formed in a first region of the active pattern by removing a portion of the insulating interlayer pattern and the gate insulation pattern each, and may expose a portion of the active pattern. In this case, a width of the existing electrostatic protection diode extending in a first direction D1 that is parallel (e.g., substantially parallel) to an upper surface of a substrate may be increased due to a process margin in a process for forming the first and second contact holes. Thus, as a width of the existing electrostatic protection diode is increased, a peripheral region (e.g., a dead space where a plurality of wirings is disposed) of the OLED device may be increased to secure a space where the existing electrostatic protection diode having a relatively increased width is disposed when the existing electrostatic protection diode is disposed in an OLED device. Also, when the OLED device has a relatively small number of the electrostatic protection diodes due to a limited space of the OLED device, static electricity may not escape to outside of the OLED device, and then the static electricity may penetrate into a pixel region where a plurality of pixels structures is disposed. Accordingly, the OLED device may be deteriorated.

As the electrostatic protection diode 100 according to example embodiments includes one contact hole (e.g., a sole contact hole), a width of the electrostatic protection diode 100 may be relatively reduced. Thus, when the electrostatic protection diode 100 having a relatively reduced width is disposed in the OLED device, a peripheral region of the OLED device may be relatively reduced because a space where the electrostatic protection diode 100 having a relatively reduced width is disposed may be reduced. Also, the OLED device may have a relatively large number of electrostatic protection diodes 100 in a limited space, and since static electricity is readily escaped to outside of the OLED device through the electrostatic protection diode 100, it may prevent the static electricity from penetrating into a pixel region (or it may reduce the penetration of static electricity into the pixel region). Accordingly, a deterioration of the OLED device may be relatively reduced.

Figure 6:
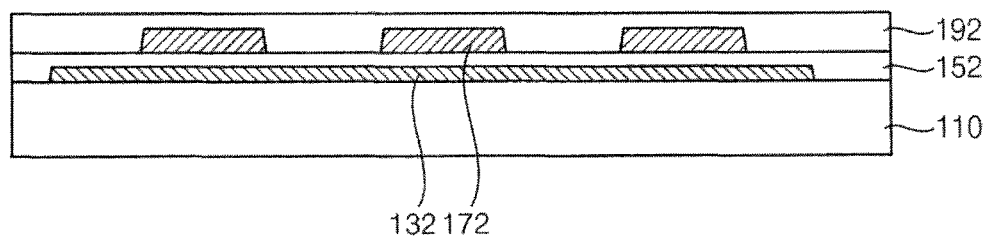
FIGS. 6-8 are cross-sectional views illustrating a method of manufacturing an electrostatic protection diode in accordance with example embodiments.
Figure 7:
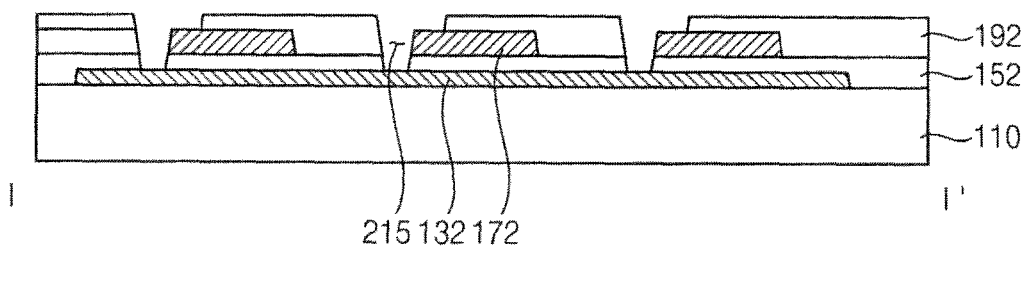
Figure 8:
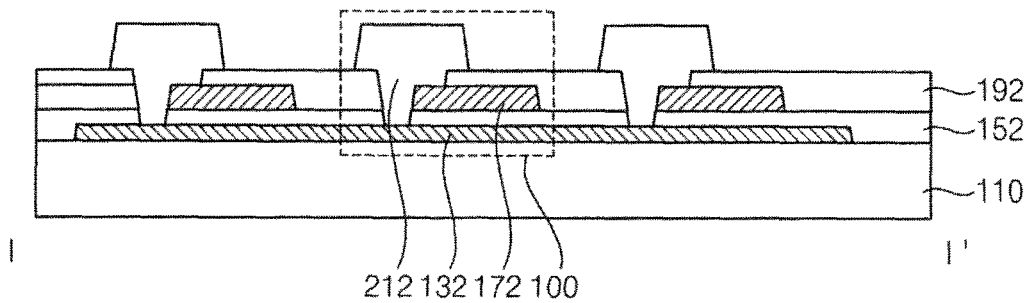

FIGS. 6-8 are cross-sectional views illustrating a method of manufacturing an electrostatic protection diode in accordance with example embodiments.

Referring to FIG. 6, a substrate 110 including transparent or opaque materials may be provided. The substrate 110 may be formed using a rigid substrate such as a quartz substrate, a synthetic quartz substrate, a calcium fluoride substrate, a fluoride-doped quartz substrate, a sodalime glass substrate, a non-alkali glass substrate, etc. or a flexible substrate such as a polyimide substrate.

An active pattern 132 may be formed using on the substrate 110. The active pattern 132 may include a first region, a second region, and a third region. The first region may be spaced apart from the second region, and the third region may be located between the first region and the second region. The active pattern 132 may be formed using any of an oxide semiconductor, an inorganic semiconductor, an organic semiconductor, etc.

A gate insulation pattern 152 may be formed on the substrate 110 and the active pattern 132. The gate insulation pattern 152 may cover the active pattern 132, and may be formed on the entire (or substantially the entire) substrate 110. For example, the gate insulation pattern 152 may suitably or sufficiently cover the active pattern 132 on the substrate 110, and may have a substantially level surface without a step around the active pattern 132. In some embodiments, the gate insulation pattern 152 may cover the active pattern 132 on the substrate 110, and may be formed to have a substantially uniform thickness along a profile of the active pattern 132. The gate insulation pattern 152 may include organic materials and/or inorganic materials. In example embodiments, the gate insulation pattern 152 may be formed using inorganic materials such as a silicon compound, a metal oxide, etc.

A gate electrode pattern 172 may be formed in the third region on the gate insulation pattern 152. The gate electrode pattern 172 may be formed on a portion of the gate insulation pattern 152 under which the active pattern 132 is located. The gate electrode pattern 172 may be formed using a metal, a metal alloy, a metal nitride, a conductive metal oxide, transparent conductive materials, etc. These may be used alone or in a suitable combination thereof. In some embodiments, the gate electrode pattern 172 may be formed as a multi-layered structure.

An insulating interlayer pattern 192 may be formed on the gate insulation pattern 152 and the gate electrode pattern 172. The insulating interlayer pattern 192 may cover the gate electrode pattern 172, and may be formed on the entire (or substantially the entire) gate insulation pattern 152. For example, the insulating interlayer pattern 192 may suitably or sufficiently cover the gate electrode pattern 172 on the gate insulation pattern 152, and may have a substantially level surface without a step around the gate electrode pattern 172. In some embodiments, the insulating interlayer pattern 192 may cover the gate electrode pattern 172 on the gate insulation pattern 152, and may be formed to have a substantially uniform thickness along a profile of the gate electrode pattern 172. The insulating interlayer pattern 192 may include organic materials and/or inorganic materials. In example embodiments, the gate insulation pattern 152 may be formed using inorganic materials such as a silicon compound, a metal oxide, etc.

Referring to FIG. 7, a contact hole 215 may be formed to overlap a portion of the first region of the active pattern 132 and a portion of the third region of the active pattern 132. In other words, the contact hole 215 may be formed to overlap a portion of the gate electrode pattern 172 and a portion of the active pattern 132. The contact hole 215 may be formed by removing a portion of the gate insulation pattern 152 and the insulating interlayer pattern 192 each, and a portion of the gate electrode pattern 172 and a portion of the active pattern 132 may be exposed via the contact hole 215. For example, the contact hole 215 may concurrently (e.g., simultaneously) expose a portion of an upper surface of the gate electrode pattern 172, a portion of a side surface of the gate electrode pattern 172, and a portion of an upper surface of the active pattern 132.

Referring to FIG. 8, a connection pattern 212 may be formed on the insulating interlayer pattern 192. In example embodiments, the connection pattern 212 may overlap a portion of the first and third regions of the active pattern 132 of the active pattern 132. In other words, the connection pattern 212 may overlap a portion of the gate electrode pattern 172 and a portion of the active pattern 132. The connection pattern 212 may be in direct contact with a portion of gate electrode pattern 172 and a portion of the active pattern 132 via the contact hole 215. For example, the connection pattern 212 may be in concurrent (e.g., simultaneous) contact with a portion of an upper surface of the gate electrode pattern 172, a portion of a side surface of the gate electrode pattern 172, and a portion of an upper surface of the active pattern 132. In some embodiments, the connection pattern 212 may be in direct contact with the gate electrode pattern 172 and the active pattern 132 via the contact hole 215, and may be electrically coupled to (e.g., electrically connected to) the gate electrode pattern 172 and the active pattern 132. The connection pattern 212 may be formed using a metal, a metal nitride, a conductive metal oxide, and/or transparent conductive materials, etc. These may be used alone or in a suitable combination thereof. In some example embodiments, the connection pattern 212 may be formed as a multi-layered structure. Accordingly, an electrostatic protection diode 100 illustrated in FIG. 5 may be formed.

In a manufacturing method of the electrostatic protection diode 1100 according to example embodiments, since the number of the contact holes 215 is relatively decreased, a manufacturing cost of the electrostatic protection diode 100 may be reduced.

Figure 9:
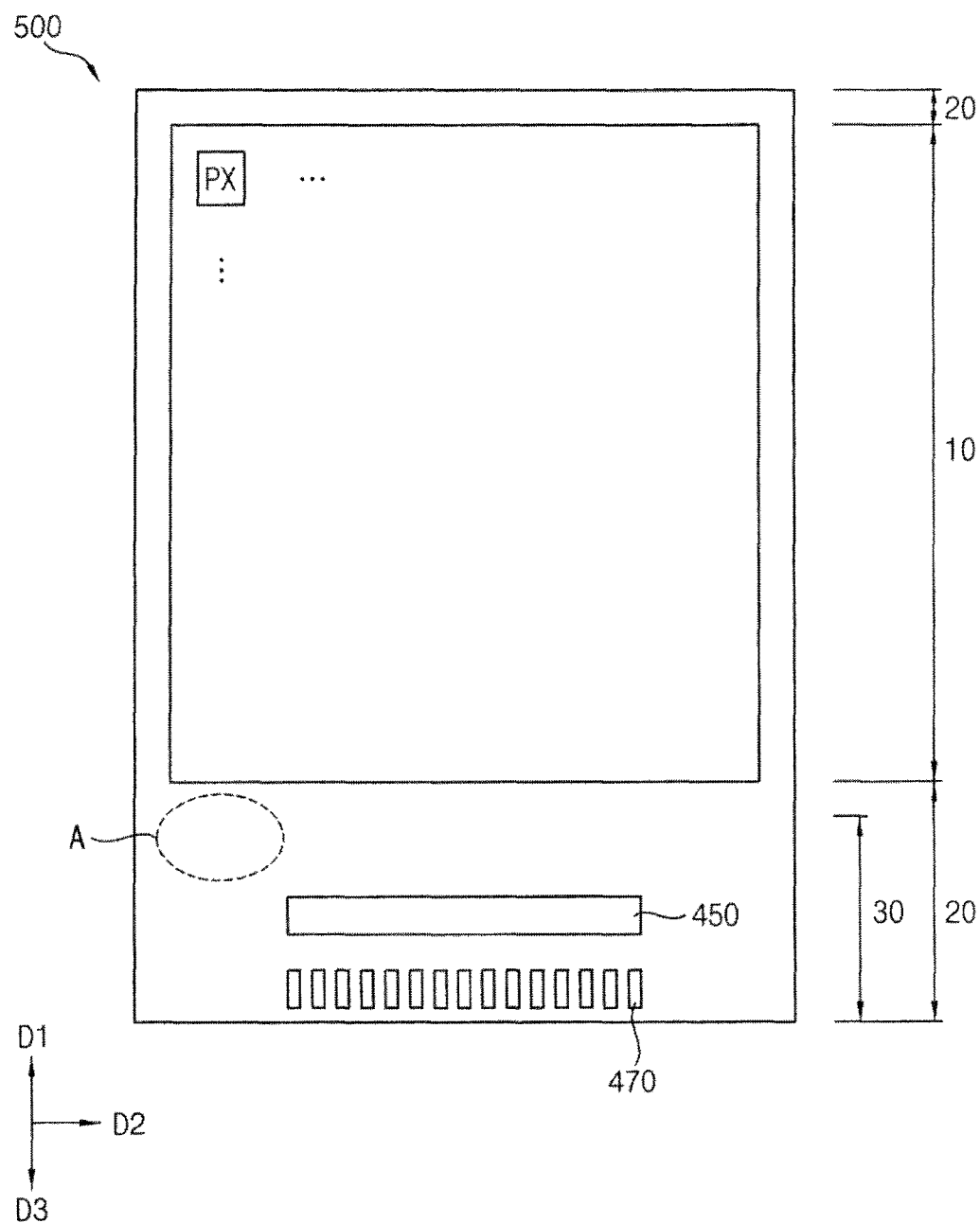
FIG. 9 is a plan view illustrating an organic light emitting display (OLED) device in accordance with example embodiments.

FIG. 9 is a plan view illustrating an organic light emitting display (OLED) device in accordance with example embodiments.

Referring to FIG. 9, an OLED device 500 may include a pixel region 10 and a peripheral region 20 surrounding the pixel region 10. A plurality of pixel structures PX may be disposed in the pixel region 10, and a plurality of wirings electrically coupled to (e.g., electrically connected to) the pixel structures PX may be disposed in the peripheral region 20. For example, the wirings may include any of data signal wirings, scan signal wirings, initialization signal wirings, emission signal wirings, power supply voltage wirings, etc. In example embodiments, an electrostatic protection structure including electrostatic protection diodes may be disposed in the wirings.

A pad region 30 may be located in a portion of the peripheral region 20. For example, the pad region 30 may be located toward a third direction D3 from the pixel region 10, and the third direction D3 may be opposite to a first direction D1. In addition, pad electrodes 470 and a driving integrated circuit 450 may be disposed in the pad region 30. The pad electrodes 470 may be electrically coupled to (e.g., electrically connected to) an external device. The pixel structures PX disposed in the pixel region 10 may be electrically coupled to (e.g., electrically connected to) the external device electrically coupled to (e.g., electrically connected to) the pad electrodes 470 through the wirings disposed in the peripheral region 20. For example, the external device may be electrically coupled to (e.g., electrically connected to) the electrostatic protection diode 100 through a flexible printed circuit board. The external device may provide any of data signals, scan signals, initialization signals, emission signals, power supply voltages, etc. to the electrostatic protection diode 100. In some example embodiments, the driving integrated circuit may be installed (or mounted) in the flexible printed circuit board.

Figure 11:
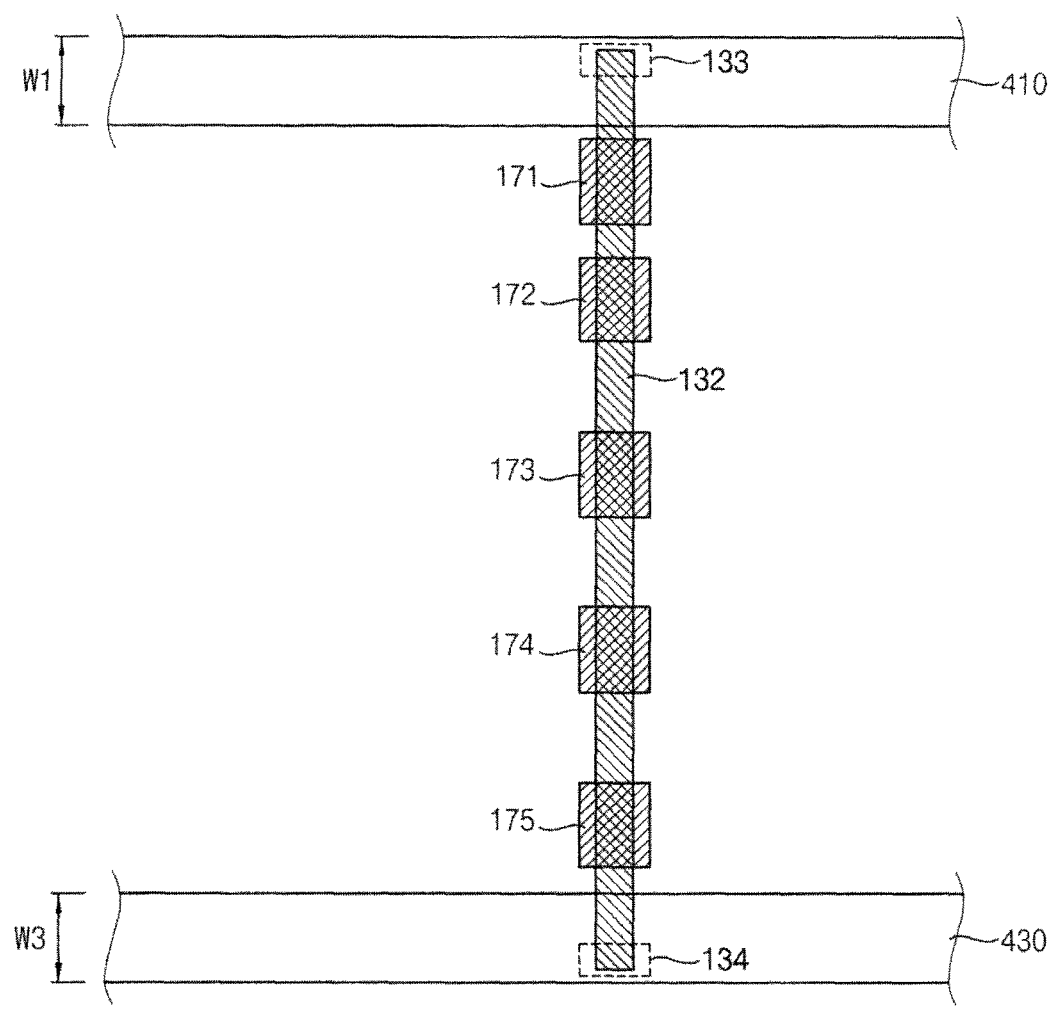
Figure 12:
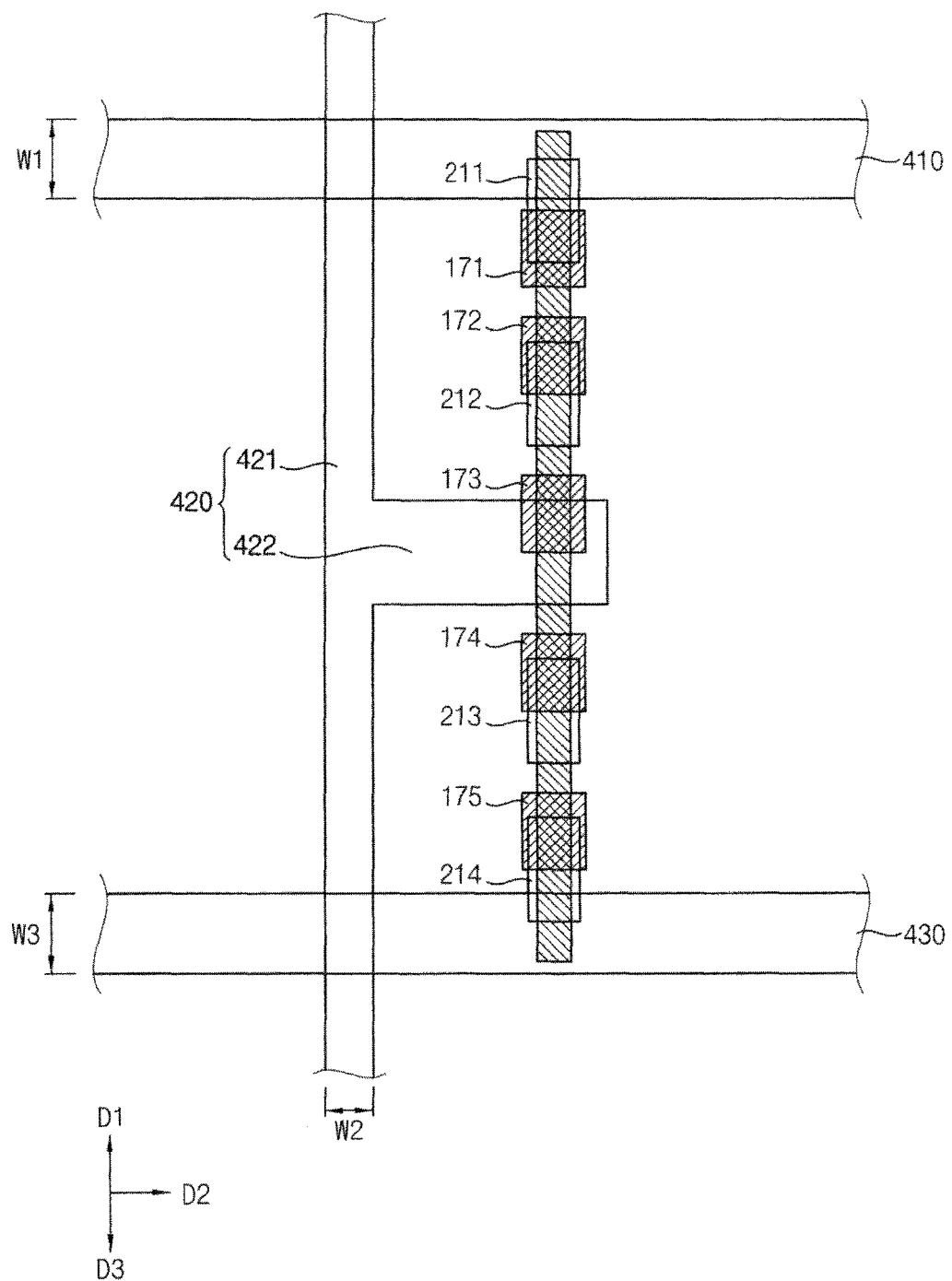
Figure 13:
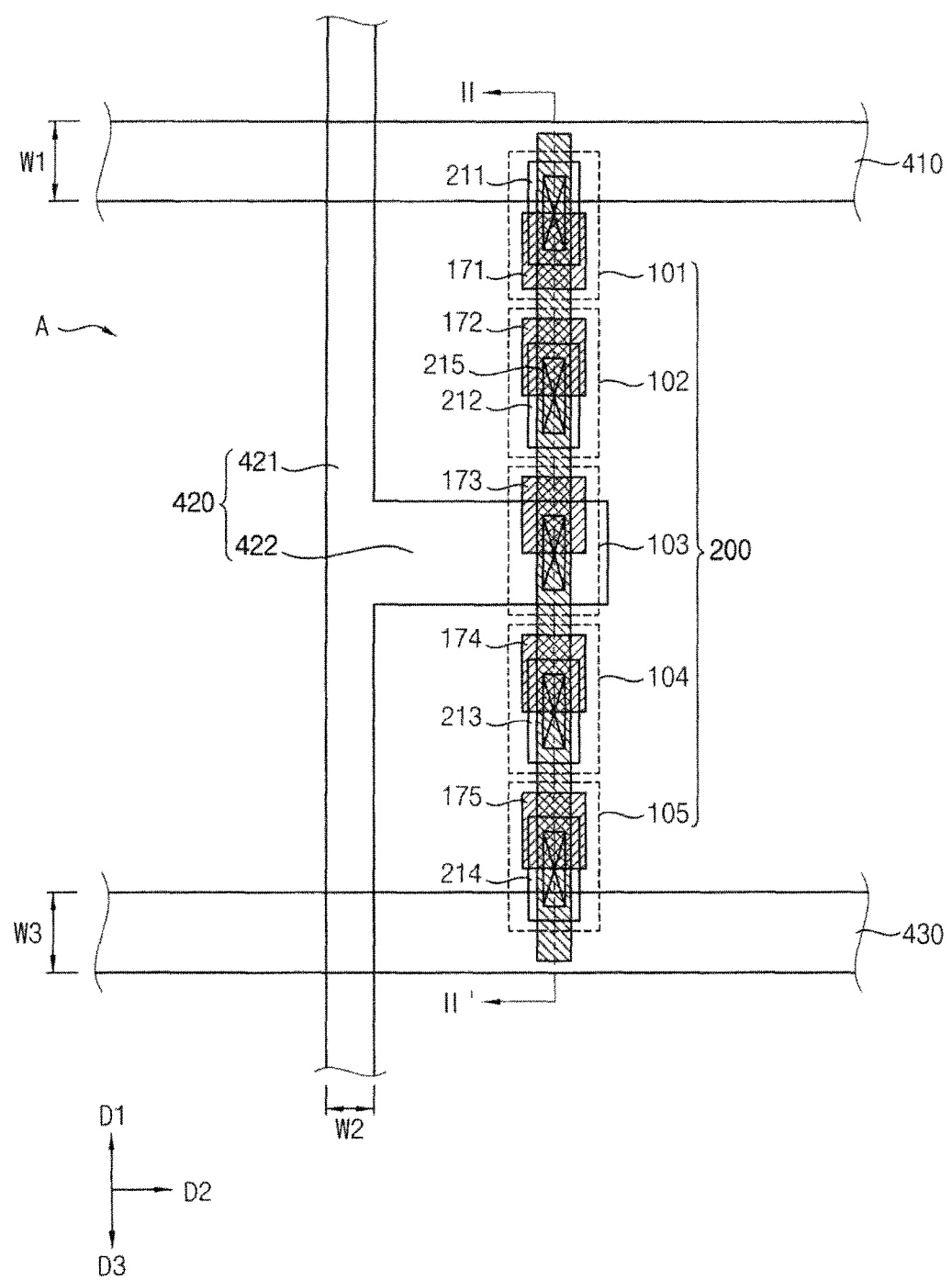
Figure 14:
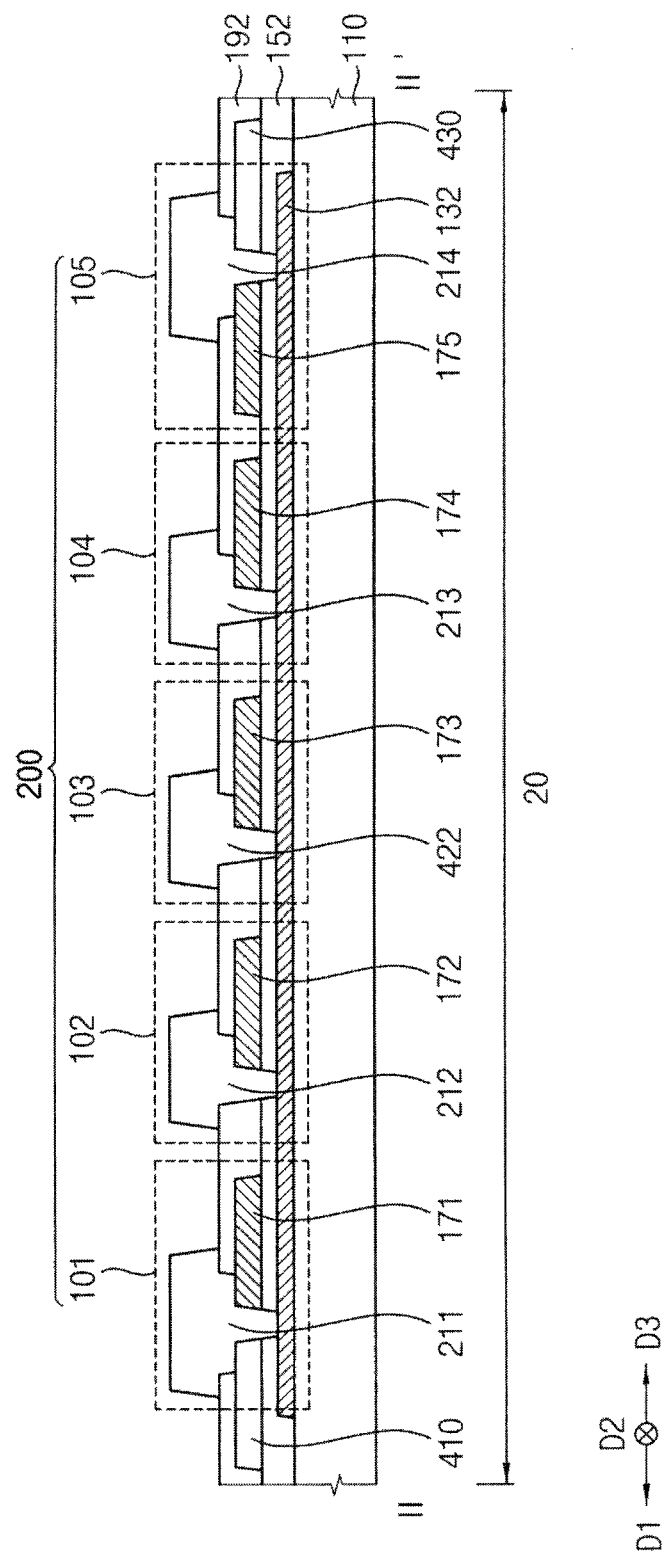
FIG. 14 is a cross-sectional view taken along a line II-II' of FIG. 13.
Figure 15:
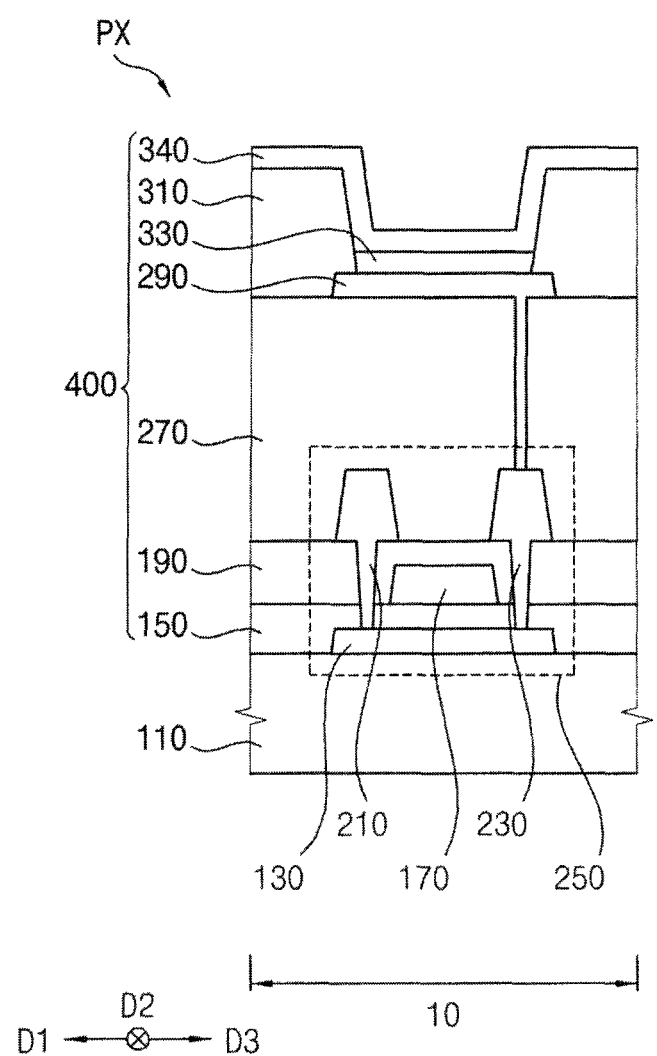
FIG. 15 is a cross-sectional view illustrating a pixel structure included in the OLED device of FIG. 13.

FIGS. 10-13 are layout diagrams where region A of FIG. 9 is enlarged for describing an electrostatic protection diode structure included in the OLED device, and FIG. 14 is a cross-sectional view taken along a line II-II' of FIG. 13. In addition, FIG. 15 is a cross-sectional view for describing a pixel structure included in the OLED device of FIG. 13.

Referring to FIGS. 10-15, an OLED device 500 may include a substrate 110, a pixel structure 400, an electrostatic protection structure 200, wirings, etc. The pixel structure 400 may include a semiconductor element 250, a planarization layer 270, a lower electrode 290, a pixel defining layer 310, a light emitting layer 330, and an upper electrode 340. The wirings may include a first wiring 410, a second wiring 420, and a third wiring 430. Here, the second wiring 420 may have a first extension 421 and a second extension 422. The electrostatic protection structure 200 may include a first electrostatic protection diode 101 constituting an active pattern 132, a first gate electrode pattern 171, and a first connection pattern 211, a second electrostatic protection diode 102 constituting the active pattern 132, a second gate electrode pattern 172, and a second connection pattern 212, a third electrostatic protection diode 103 constituting the active pattern 132, a third gate electrode pattern 173, and the second extension 422, a fourth electrostatic protection diode 104 constituting the active pattern 132, a fourth gate electrode pattern 174, a third connection pattern 213, and a fifth electrostatic protection diode 105 constituting the active pattern 132, a fifth gate electrode pattern 175, and a fourth connection pattern 214.

The substrate 110 including a pixel region 10 and a peripheral region 20 may be provided. The substrate 110 may include transparent or opaque materials. For example, the substrate 110 may include any of a quartz substrate, a synthetic quartz substrate, a calcium fluoride substrate, a fluoride-doped quartz substrate, a sodalime glass substrate, a non-alkali glass substrate, etc. In some embodiments, the substrate 110 may include a flexible transparent material such as a flexible transparent resin substrate (e.g., a polyimide substrate). For example, the polyimide substrate may include any of a first polyimide layer, a barrier film layer, a second polyimide layer, etc. Since the polyimide substrate is relatively thin and flexible, the polyimide substrate may be formed on a rigid glass substrate to help support the formation of an upper structure (e.g., the pixel structure 400). In some embodiments, the substrate 110 may have a structure in which the first polyimide layer, the barrier film layer and the second polyimide layer are stacked on the rigid glass substrate. In embodiments of methods of manufacturing the OLED device, after an insulating layer (e.g., a buffer layer) is provided on the second polyimide layer of the polyimide substrate, the upper structure may be formed on the buffer layer. After the upper structure is formed on the buffer layer, the rigid glass substrate on which the polyimide substrate is formed may be removed. It may be difficult to directly form the upper structure on the polyimide substrate because the polyimide substrate is relatively thin and flexible. Accordingly, the upper structure is formed on the polyimide substrate and the rigid glass substrate, and then the polyimide substrate may serve as the substrate 110 of the OLED device 500 after the removal of the rigid glass substrate.

A buffer layer may be disposed on the substrate 110. The buffer layer may be disposed on the entire (or substantially the entire) substrate 110. The buffer layer may prevent or reduce the diffusion of metal atoms and/or impurities from the substrate 110 into the semiconductor element 250. Additionally, the buffer layer may control a rate of a heat transfer in a crystallization process for forming the active layer 130 and the active pattern 132, thereby obtaining the active layer 130 and the active pattern 132, which are substantially uniform. Furthermore, the buffer layer may improve a surface flatness of the substrate 110 when a surface of the substrate 110 is relatively irregular. According to a type (or kind) of the substrate 110, at least two buffer layers may be provided on the substrate 110, or the buffer layer may not be disposed (e.g., the buffer layer may be omitted). For example, the buffer layer may include organic materials and/or inorganic materials.

The active layer 130 may be disposed in the pixel region 10 on the substrate 110. For example, the active layer 130 may include any of an oxide semiconductor, an inorganic semiconductor (e.g., amorphous silicon, polysilicon, etc.), an organic semiconductor, etc.

Figure 10:
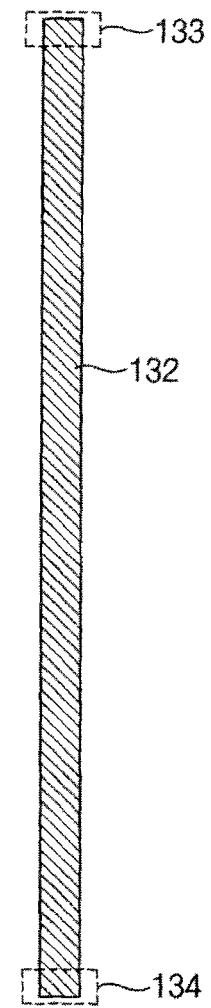
FIGS. 10-13 are layout diagrams where region A of FIG. 9 is enlarged for describing an electrostatic protection diode structure included in the OLED device.

The active pattern 132 may be disposed in the peripheral region 20 on the substrate 110. As illustrated in FIG. 10, the active pattern 132 may extend in a first direction D1 on the substrate 110. The active pattern 132 may include a first region, a second region, and a third region. The first region may be spaced apart from the second region, and the third region may be located between the first region and the second region. In addition, the active pattern 132 may include a first distal end portion 133 and a second distal end portion 134. The first distal end portion 133 may be located toward the first direction D1 from the center of the active pattern 132, and the second distal end portion 134 may be located toward the third direction D3 from the center of the active pattern 132. In other words, the first distal end portion 133 and the second distal end portion 134 may be opposite to each other. In example embodiments, the active pattern 132 and the active layer 130 may be concurrently (e.g., simultaneously) formed using the same or substantially the same material.

The gate insulation layer 150 may be disposed on the active layer 130. For example, the gate insulation layer 150 may suitably or sufficiently cover the active layer 130 on the substrate 110, and may have a substantially level surface without a step around the active layer 130. In some embodiments, the gate insulation layer 150 may cover the active layer 130, and may cover the active layer 130 on the substrate 110, and may be disposed to have a substantially uniform thickness along a profile of the active layer 130. The gate insulation layer 150 may include a silicon compound, a metal oxide, etc. For example, the gate insulation layer 150 may include any of SiOx, SiNx, SiOxNy, SiOxCy, SiCxNy, AlOx, AlNx, TaOx, HfOx, ZrOx, TiOx, etc.

The gate insulation pattern 152 may be disposed in the peripheral region 20 on the substrate 110 and the active pattern 132. The gate insulation pattern 152 may suitably or sufficiently cover the active pattern 132 on the substrate 110, and may have a substantially level surface without a step around the active pattern 132. In some embodiments, the gate insulation pattern 152 may cover the active pattern 132 on the substrate 110, and may be disposed to have a substantially uniform thickness along a profile of the active pattern 132. In example embodiments, the gate insulation pattern 152 and the gate insulation layer 150 may be concurrently (e.g., simultaneously) formed using the same or substantially the same material. In other words, the gate insulation pattern 152 and the gate insulation layer 150 may be located at the same level.

The gate electrode 170 may be disposed in the pixel region 10 on the gate insulation layer 150. The gate electrode 170 may be disposed on a portion of the gate insulation layer 150 under which the active layer 130 is located in the pixel region 10. The gate electrode 170 may include any of a metal, a metal alloy, a metal nitride, a conductive metal oxide, transparent conductive materials, etc. For example, the gate electrode 170 may include any of Au, Ag, Al, Pt, Ni, Ti, Pd, Mg, Ca, Li, Cr, Ta, W, Cu, Mo, Sc, Nd, Ir, an alloy of aluminum, AlNx, an alloy of silver, WNx, an alloy of copper, an alloy of molybdenum, TiNx, CrNx, TaNx, SRO, ZnOx, ITO, SnOx, InOx, GaOx, IZO, etc. These may be used alone or in a suitable combination thereof. In some example embodiments, the gate electrode 170 may have a multi-layered structure.

The first wiring 410, the third wiring 430, the first gate electrode pattern 171, the second gate electrode pattern 172, the third gate electrode pattern 173, the fourth gate electrode pattern 174, and the fifth gate electrode pattern 175 may be disposed in the peripheral region 20 on the gate insulation pattern 152.

As illustrated in FIG. 11, the first wiring 410 may extend in a second direction D2 that is perpendicular (e.g., substantially perpendicular) to the first and third directions D1 and D3. In addition, the first wiring 410 may have a first width W1. In example embodiments, a portion of the first wiring 410 may overlap the first distal end portion 133 of the active pattern 132. The first wiring 410 may include any of data signal wirings, scan signal wirings, initialization signal wirings, emission signal wirings, power supply voltage wirings, etc. In example embodiments, the first wiring 410 may be a high power supply voltage wiring.

The third wiring 430 may be spaced apart from the first wiring 410 in the third direction D3, and may extend in the second direction D2. In addition, the third wiring 430 may have a third width W3. In example embodiments, a portion of the third wiring 430 may overlap the second distal end portion 134 of the active pattern 132. In addition, the first width W1 may be substantially the same as (or identical to) the third width W3. The third wiring 430 may include any of data signal wirings, scan signal wirings, initialization signal wirings, emission signal wirings, power supply voltage wirings, etc. In example embodiments, the third wiring 430 may be a low power supply voltage wiring. For example, a voltage level of the third wiring 430 may be less than a voltage level of the first wiring 410.

The first gate electrode pattern 171, the second gate electrode pattern 172, the third gate electrode pattern 173, the fourth gate electrode pattern 174, and the fifth gate electrode pattern 175 may be disposed to overlap the active pattern 132, and may be spaced apart from each other. For example, the first gate electrode pattern 171 may be disposed adjacent to the first wiring 410, and the fifth gate electrode pattern 175 may be disposed adjacent to third wiring 430. In addition, the second gate electrode pattern 172, the third gate electrode pattern 173, and the fourth gate electrode pattern 174 may be sequentially disposed between the first gate electrode pattern 171 and the fifth gate electrode pattern 175.

In example embodiments, the gate electrode 170, the first wiring 410, the third wiring 430, the first gate electrode pattern 171, the second gate electrode pattern 172, the third gate electrode pattern 173, the fourth gate electrode pattern 174, and the fifth gate electrode pattern 175 may be concurrently (e.g., simultaneously) formed using the same or substantially the same material. For example, the gate electrode 170, the first and third wirings 410 and 430, and the first, second, third, fourth, and fifth gate electrode patterns 171, 172, 173, 174, and 175 may be located at the same level.

Referring again to FIGS. 10-15, the insulating interlayer 190 may be disposed in the pixel region 10 on the gate insulation layer 150 and the gate electrode 170. For example, the insulating interlayer 190 may suitably or sufficiently cover the gate electrode 170 on the gate insulation layer 150, and may have a substantially level surface without a step around the gate electrode 170. In some embodiments, the insulating interlayer 190 may cover the gate electrode 170 on the gate insulation layer 150, and may be disposed to have a substantially uniform thickness along a profile of the gate electrode 170. The insulating interlayer 190 may include any of a silicon compound, a metal oxide, etc.

The insulating interlayer pattern 192 may be disposed in the peripheral region 20 on the gate insulation pattern 152, the first and third wirings 410 and 430, and the first, second, third, fourth, and fifth gate electrode patterns 171, 172, 173, 174, and 175. For example, the insulating interlayer pattern 192 may suitably or sufficiently cover the first and third wirings 410 and 430, and the first, second, third, fourth, and fifth gate electrode patterns 171, 172, 173, 174, and 175 on the gate insulation pattern 152, and may have a substantially level surface without a step around the first and third wirings 410 and 430, and the first, second, third, fourth, and fifth gate electrode patterns 171, 172, 173, 174, and 175. In some embodiments, the insulating interlayer pattern 192 may cover the first and third wirings 410 and 430, and the first, second, third, fourth, and fifth gate electrode patterns 171, 172, 173, 174, and 175 on the gate insulation pattern 152, and may be disposed to have a substantially uniform thickness along a profile of the first and third wirings 410 and 430, and the first, second, third, fourth, and fifth gate electrode patterns 171, 172, 173, 174, and 175. In example embodiments, the insulating interlayer 190 and the insulating interlayer pattern 192 may be concurrently (e.g., simultaneously) formed using the same or substantially the same material. In other words, the insulating interlayer 190 and the insulating interlayer pattern 192 may be located at the same level.

The source electrode 210 and the drain electrode 230 may be disposed in the pixel region 10 on the insulating interlayer 190. The source electrode 210 may be in direct contact with a first side (e.g., a source region) of the active layer 130 via a contact hole formed by removing a portion of the gate insulation layer 150 and the insulating interlayer 190 each. The drain electrode 230 may be in direct contact with a second side (e.g., a drain region) of the active layer 130 via a contact hole formed by removing another portion of the gate insulation layer 150 and the insulating interlayer 190 each. The source electrode 210 and the drain electrode 230 may include any of a metal, an alloy, a metal nitride, a conductive metal oxide, transparent conductive materials, etc. These may be used alone or in a suitable combination thereof. In some example embodiments, each of the source and drain electrodes 210 and 230 may have a multi-layered structure. Accordingly, the semiconductor element 250 including the active layer 130, the gate insulation layer 150, the gate electrode 170, the insulating interlayer 190, the source electrode 210, and the drain electrode 230 may be disposed (e.g., may be formed as described herein).

In example embodiments, the semiconductor element 250 has a top gate structure, but not being limited thereto. For example, in some example embodiments, the semiconductor element 250 may have a bottom gate structure.

The second wiring 420, the first connection pattern 211, the second connection pattern 212, the third connection pattern 213, and the fourth connection pattern 214 may be disposed in the peripheral region 20 on the insulating interlayer pattern 192.

As illustrated in FIGS. 12-14, the first connection pattern 211, the second connection pattern 212, the third connection pattern 213, and the fourth connection pattern 214 may be disposed on the first gate electrode pattern 171, the second gate electrode pattern 172, the fourth gate electrode pattern 174, and the fifth gate electrode pattern 175, and may overlap the first gate electrode pattern 171, the second gate electrode pattern 172, the fourth gate electrode pattern 174, and the fifth gate electrode pattern 175, respectively.

For example, the first connection pattern 211 may overlap a portion of the first wiring 410, a portion of the active pattern 132 that is located between the first wiring 410 and the first gate electrode pattern 171, and a portion of the first gate electrode pattern 171. Here, the first region of the active pattern 132 may correspond to a portion of the active pattern 132, and the third region of the active pattern 132 may correspond to a portion of the first gate electrode pattern 171. The first connection pattern 211 may be in direct contact with a portion of the first wiring 410, a portion of the first gate electrode pattern 171, and a portion of the active pattern 132 via a contact hole 215 formed by removing a portion of the insulating interlayer pattern 192 and the gate insulation pattern 152 each. For example, the first connection pattern 211 may be in concurrent (e.g., simultaneous) contact with a portion of an upper surface of the first wiring 410, a portion of a side surface of the first wiring 410, a portion of an upper surface of the first gate electrode pattern 171, a portion of a side surface of the first gate electrode pattern 171, and a portion of an upper surface of the active pattern 132. In some embodiments, the first connection pattern 211 may be in concurrent (e.g., simultaneous) contact with the first wiring 410, the first gate electrode pattern 171, and the active pattern 132 via the contact hole 215, and may be electrically coupled to (e.g., electrically connected to) the first wiring 410, the second gate electrode pattern 172, and the active pattern 132.

The fourth connection pattern 214 may overlap a portion of the third wiring 430, a portion of the active pattern 132 that is located between the third wiring 430 and the fifth gate electrode pattern 175, and a portion of the fifth gate electrode pattern 175. Here, the first region of the active pattern 132 may correspond to a portion of the active pattern 132, and the third region may correspond to a portion of the fifth gate electrode pattern 175. The fourth connection pattern 214 may be in direct contact with a portion of the third wiring 430, a portion of the fifth gate electrode pattern 175, and a portion of the active pattern 132 via the contact hole 215 formed by removing a portion of the insulating interlayer pattern 192 and the gate insulation pattern 152 each. For example, the fourth connection pattern 214 may be in concurrent (e.g., simultaneous) contact with a portion of an upper surface of the third wiring 430, a portion of a side surface of the third wiring 430, a portion of an upper surface of the fifth gate electrode pattern 175, a portion of a side surface of the fifth gate electrode pattern 175, and a portion of an upper surface of the active pattern 132. In some embodiments, the fourth connection pattern 214 may be in concurrent (e.g., simultaneous) contact with the third wiring 430, the fifth gate electrode pattern 175, and the active pattern 132 via the contact hole 215, and may be electrically coupled to (e.g., electrically connected to) the third wiring 430, the fifth gate electrode pattern 175, and the active pattern 132.

The second connection pattern 212 may overlap a portion of the active pattern 132 that is located between the first and second gate electrode patterns 171 and 172 and a portion of the second gate electrode pattern 172. Here, the first region of the active pattern 132 may correspond to a portion of the active pattern 132, and the third region of the active pattern 132 may correspond to a portion of the second gate electrode pattern 172. The second connection pattern 212 may be in direct contact with a portion of the second gate electrode pattern 172 and a portion of the active pattern 132 via the contact hole 215 formed by removing a portion of the insulating interlayer pattern 192 and the gate insulation pattern 152 each. For example, the second connection pattern 212 may be in concurrent (e.g., simultaneous) contact with a portion of an upper surface of the second gate electrode pattern 172, a portion of a side surface of the second gate electrode pattern 172, and a portion of an upper surface of the active pattern 132. In some embodiments, the second connection pattern 212 may be in concurrent (e.g., simultaneous) contact with the second gate electrode pattern 172 and the active pattern 132 via the contact hole 215, and may be electrically coupled to (e.g., electrically connected to) the second gate electrode pattern 172 and the active pattern 132.

The third connection pattern 213 may overlap a portion of the active pattern 132 that is located between the third and fourth gate electrodes patterns 173 and 174 and a portion of the fourth gate electrode pattern 174. Here, the first region of the active pattern 132 may correspond to a portion of the active pattern 132, and the third region of the active pattern 132 may correspond to a portion of the fourth gate electrode pattern 174. The third connection pattern 213 may be in direct contact with a portion of the fourth gate electrode pattern 174 and a portion of the active pattern 132 via the contact hole 215 formed by removing a portion of the insulating interlayer pattern 192 and the gate insulation pattern 152 each. For example, the third connection pattern 213 may be in concurrent (e.g., simultaneous) contact with a portion of an upper surface of the fourth gate electrode pattern 174, a portion of a side surface of the fourth gate electrode pattern 174, and a portion of an upper surface of the active pattern 132. In some embodiments, the third connection pattern 213 may be in concurrent (e.g., simultaneous) contact with the fourth gate electrode pattern 174 and the active pattern 132 via the contact hole 215, and may be electrically coupled to (e.g., electrically connected to) the fourth gate electrode pattern 174 and the active pattern 132.

The second wiring 420 may be intersected with the first wiring 410 and/or the third wiring 430, and may be spaced apart from the active pattern 132. The second wiring 420 may have a second width W2 that is less than the first and third widths W1 and W3. In example embodiments, the second wiring 420 may have the first extension 421 and the second extension 422. The first extension 421 may extend in the first direction D1, and the second extension 422 may be protruded in the second direction D2 from the first extension 421. The second extension 422 may be interposed between the second connection pattern 212 and the third connection pattern 213. In addition, the second extension 422 may overlap a portion of the third gate electrode pattern 173 and a portion of the active pattern 132 that is located between the second gate electrode pattern 172 and the third gate electrode pattern 173. Here, the first region of the active pattern 132 may correspond to a portion of the active pattern 132, and the third region of the active pattern 132 may correspond to a portion of the third gate electrode pattern 173. The second extension 422 may be in direct contact with a portion of the third gate electrode pattern 173 and a portion of the active pattern 132 via the contact hole 215 formed by removing a portion of the insulating interlayer pattern 192 and the gate insulation pattern 152 each. For example, the second extension 422 may be in concurrent (e.g., simultaneous) contact with a portion of an upper surface of the third gate electrode pattern 173, a portion of a side surface of the third gate electrode pattern 173, and a portion of an upper surface of the active pattern 132. In some embodiments, the second extension 422 may be in concurrent (e.g., simultaneous) contact with the third gate electrode pattern 173 and the active pattern 132 via the contact hole 215, and may be electrically coupled to (e.g., electrically connected to) the third gate electrode pattern 173 and the active pattern 132. For example, the second extension 422 may serve as a connection pattern of the third electrostatic protection diode 103.

The second wiring 420 may include any of scan signal wirings, data signal wirings, initialization signal wirings, and/or emission signal wirings. In example embodiments, the second wiring 420 may include any of the scan signal wiring, initialization signal wirings, and/or emission signal wirings.

Accordingly, the first electrostatic protection diode 101 constituting the active pattern 132, the first gate electrode pattern 171, and the first connection pattern 211, the second electrostatic protection diode 102 constituting the active pattern 132, the second gate electrode pattern 172, and the second connection pattern 212, the third electrostatic protection diode 103 constituting the active pattern 132, the third gate electrode pattern 173, and the second extension 422, the fourth electrostatic protection diode 104 constituting the active pattern 132, the fourth gate electrode pattern 174, and the third connection pattern 213, and the fifth electrostatic protection diode 105 constituting the active pattern 132, the fifth gate electrode pattern 175, and the fourth connection pattern 214 may be disposed (e.g., may be formed as described herein). For example, the electrostatic protection structure 200 may be formed as described herein.

When static electricity generated in a manufacturing process of the OLED device penetrates into the second wiring 420, the electrostatic protection structure 200 may transport the static electricity from the second wiring 420 having a relatively small width into the first wiring 410 having a relatively large width. Accordingly, it may prevent that the static electricity is penetrated into the pixel region 10 through the second wiring 420 (or it may reduce the penetration of static electricity into the pixel region 10 through the second wiring 420). As described above, when the first wiring 410 is a high power supply voltage wiring and the third wiring 430 is a low power supply voltage wiring, a current may flow in the third direction D3. However, the current that flows in the third direction D3 may be blocked or reduced by the first, second, third, fourth, and fifth electrostatic protection diodes 101, 102, 103, 104, and 105 included in the electrostatic protection structure 200. For example, although the OLED device 500 is activated (e.g., a turned-on state), the current may not flow from the first wiring 410 into the third wiring 430.

In example embodiments, the electrostatic protection structure 200 has five electrostatic protection diodes, but not being limited thereto. For example, the electrostatic protection structure 200 may have no more than four electrostatic protection diodes or at least six electrostatic protection diodes.

In addition, in example embodiments, the electrostatic protection structure 200 is located in the region A of FIG. 9, but not being limited thereto. In some example embodiments, the electrostatic protection structure 200 may be located in the peripheral region 20 except the region A.

Referring again to FIGS. 10-15, the planarization layer 270 may be disposed in pixel region 10 on the insulating interlayer 190, the source electrode 210 and the drain electrode 230. For example, the planarization layer 270 may be disposed as a high thickness to suitably or sufficiently cover the insulating interlayer 190 and the source and drain electrodes 210 and 230. In this case, the planarization layer 270 may have a substantially flat upper surface, and a planarization process may be further performed on the planarization layer 270 to implement the flat upper surface of the planarization layer 270. In some embodiments, the planarization layer 270 may cover the insulating interlayer 190 and the source and drain electrodes 210 and 230, and may be disposed to have a substantially uniform thickness along a profile of the insulating interlayer 190 and the source and drain electrodes 210 and 230. The planarization layer 270 may include organic materials and/or inorganic materials. In example embodiments, the planarization layer 270 may include organic materials. For example, the planarization layer 270 may include any of a polyimide-based resin, a photoresist, an acryl-based resin, a polyamide-based resin, a siloxane-based resin, etc. In some example embodiments, the planarization layer 270 may be disposed in the peripheral region 20 on the electrostatic protection structure 200.

The lower electrode 290 may be disposed in the pixel region 10 on the planarization layer 270. The lower electrode 290 may be in contact with the drain electrode 230 via a contact hole formed by removing a portion of the planarization layer 270. In addition, the lower electrode 290 may be electrically coupled to (e.g., electrically connected to) the semiconductor element 250. For example, the lower electrode 290 may include any of a metal, a metal alloy, a metal nitride, conductive metal oxide, transparent conductive materials, etc. These may be used alone or in a suitable combination thereof. In some embodiments, the lower electrode 290 may have a multi-layered structure.

The pixel defining layer 310 may be disposed in the pixel region 10 on the planarization layer 270, and may cover both lateral portions of the lower electrode 290. The pixel defining layer 310 may include organic materials and/or inorganic materials. In example embodiments, the pixel defining layer 310 may include organic materials.

The light emitting layer 330 may be disposed in a portion where an upper surface of the lower electrode 290 is exposed by the pixel defining layer 310. The light emitting layer 330 may be formed using at least one of light emitting materials capable of generating different colors of light (e.g., a red color of light, a blue color of light, and a green color of light) according to sub-pixels. In some embodiments, the light emitting layer 330 may generally generate a white color of light by stacking a plurality of light emitting materials capable of generating different colors of light such as a red color of light, a green color of light, and a blue color of light. In this case, a color filter may be disposed on the light emitting layer 330 (e.g., to overlap the light emitting layer 330 on an encapsulation substrate). The color filter may include at least one selected from a red color filter, a green color filter, and a blue color filter. In some embodiments, the color filter may include (or further include) a yellow color filter, a cyan color filter, and a magenta color filter. The color filter may include a photosensitive resin or a color photoresist.

The upper electrode 340 may be disposed in the pixel region 10 on the pixel defining layer 310 and the light emitting layer 330. The upper electrode 340 may include a metal, a metal alloy, metal nitride, conductive metal oxide, transparent conductive materials, etc. These may be used alone or in a suitable combination thereof. Accordingly, the pixel structure 400 including the semiconductor element 250, the planarization layer 270, the lower electrode 290, the pixel defining layer 310, the light emitting layer 330, and the upper electrode 340 may be disposed (e.g., may be formed as described herein).

An encapsulation substrate may be disposed on the upper electrode 340. The encapsulation substrate and the substrate 110 may include substantially the same material. For example, the encapsulation substrate may include a quartz substrate, a synthetic quartz substrate, a calcium fluoride substrate, a fluoride-doped quartz substrate, a sodalime glass substrate, a non-alkali glass substrate, etc. In some example embodiments, the encapsulation substrate may include a transparent inorganic material or flexible plastic. For example, the encapsulation substrate may include a flexible transparent resin substrate. In this case, to increase flexibility of the OLED device 500, the encapsulation substrate may include a stacked structure where at least one inorganic layer and at least one organic layer are alternately stacked.

Static electricity may be generated in a manufacturing process of an OLED device, and then the static electricity may penetrate through wirings included in the OLED device into a pixel region including a plurality of pixel structures. In order to prevent this (or to reduce likelihood or extent of such an occurrence), an electrostatic protection diode may be disposed in the OLED device. An existing electrostatic protection diode may have first and second contact holes. For example, the first contact hole may be formed in a third region of an active pattern by removing a portion of an insulating interlayer pattern, and may expose a portion of a gate electrode pattern. In addition, the second contact hole may be formed in a first region of the active pattern by removing a portion of the insulating interlayer pattern and the gate insulation pattern each, and may expose a portion of the active pattern. In this case, a width of the existing electrostatic protection diode extending in the first direction D1 that is parallel (e.g., substantially parallel) to an upper surface of a substrate may be increased due to a process margin in a process for forming the first and second contact holes. Thus, as a width of the existing electrostatic protection diode is increased, a peripheral region of the OLED device may be increased to secure a space where the existing electrostatic protection diode having a relatively increased width is disposed when the existing electrostatic protection diode is disposed in an OLED device. In other words, a space between a first wiring and a third wiring may be increased. Also, when the OLED device has a relatively small number of the electrostatic protection diodes due to a limited space of the OLED device, static electricity may not escape into the outside of the OLED device, and then the static electricity may penetrate into a pixel region where a plurality of pixels structures is disposed. Accordingly, the OLED device may be deteriorated.

As each of the first, second, third, fourth, and fifth electrostatic protection diodes 101, 102, 103, 104, and 105 included in the electrostatic protection structure 200 according to example embodiments includes one contact hole 215, a width extending in the first direction D1 of the electrostatic protection structure 200 may be relatively reduced. For example, a space between the first wiring 410 and the third wiring 430 may be decreased. Thus, when the electrostatic protection structure 200 having a relatively reduced width is disposed in the OLED device 500, the peripheral region 20 of the OLED device 500 may be relatively reduced because a space where the electrostatic protection structure 200 having a relatively reduced width is disposed may be reduced. Also, the OLED device 500 may have a relatively large number of electrostatic protection structures 200 in a limited space, and since static electricity is readily escaped into the outside of the OLED device 500 through the electrostatic protection structure 200, it may prevent the static electricity from penetrating into the pixel region 10 (or it may reduce the penetration of static electricity into the pixel region 10). Accordingly, a deterioration of the OLED device 500 may be relatively reduced.

FIGS. 16-20 are cross-sectional views illustrating a method of manufacturing an OLED device in accordance with example embodiments.

Figure 16:
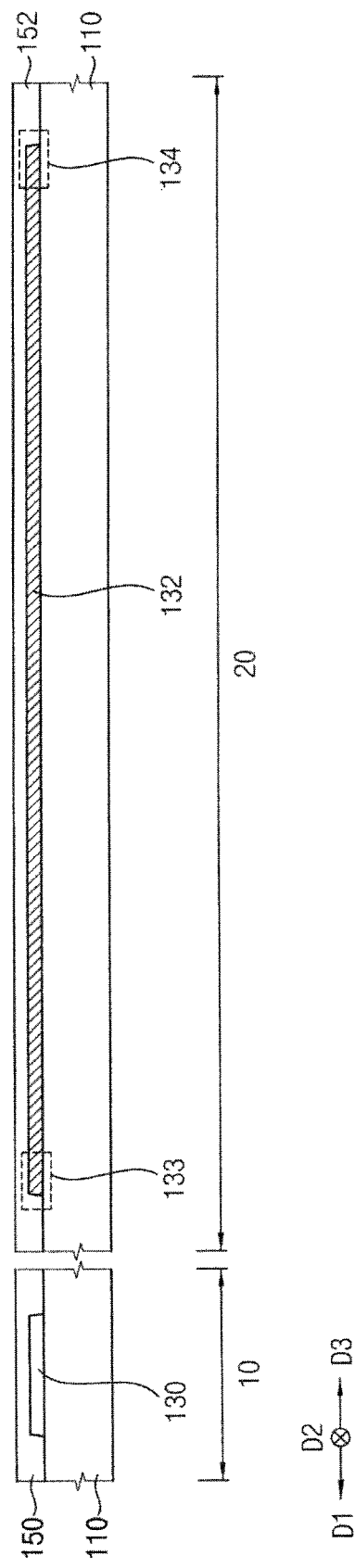
FIGS. 16-20 are cross-sectional views illustrating a method of manufacturing an OLED device in accordance with example embodiments.

Referring to FIG. 16, a substrate 110 including a pixel region 10 and a peripheral region 20 may be provided. The substrate 110 may include transparent or opaque materials. For example, the substrate 110 may be formed using a quartz substrate, a synthetic quartz substrate, a calcium fluoride substrate, a fluoride-doped quartz substrate, a sodalime glass substrate, a non-alkali glass substrate etc. In some embodiments, the substrate 110 may be formed using a flexible transparent material such as a flexible transparent resin substrate.

A buffer layer may be formed on the substrate 110. The buffer layer may be formed on the entire (or substantially the entire) substrate 110. The buffer layer may prevent or reduce the diffusion of metal atoms and/or impurities from the substrate 110 into a semiconductor element. Additionally, the buffer layer may control a rate of a heat transfer in a crystallization process for forming an active layer and an active pattern, thereby obtaining the active layer and the active pattern, which are substantially uniform. Furthermore, the buffer layer may improve a surface flatness of the substrate 110 when a surface of the substrate 110 is relatively irregular. According to a type (or kind) of the substrate 110, at least two buffer layers may be provided on the substrate 110, or the buffer layer may not be formed. For example, the buffer layer may include organic materials and/or inorganic materials.

An active layer 130 may be formed in the pixel region 10 on the substrate 110. For example, the active layer 130 may be formed using an oxide semiconductor, an inorganic semiconductor, an organic semiconductor, etc.

An active pattern 132 may be formed in the peripheral region 20 on the substrate 110. The active pattern 132 may extend in a first direction D1 on the substrate 110. The active pattern 132 may include a first region, a second region, and a third region. The first region may be spaced apart from the second region, and the third region may be located between the first region and the second region. In addition, the active pattern 132 may include a first distal end portion 133 and a second distal end portion 134. The first distal end portion 133 may be located toward the first direction D1 from the center of the active pattern 132, and the second distal end portion 134 may be located toward a third direction D3 from the center of the active pattern 132. In other words, the first distal end portion 133 and the second distal end portion 134 may be opposite to each other. In example embodiments, the active pattern 132 and the active layer 130 may be concurrently (e.g., simultaneously) formed using the same or substantially the same material.

A gate insulation layer 150 may be formed on the active layer 130. For example, the gate insulation layer 150 may suitably or sufficiently cover the active layer 130 on the substrate 110, and may have a substantially level surface without a step around the active layer 130. In some embodiments, the gate insulation layer 150 may cover the active layer 130, and may cover the active layer 130 on the substrate 110, and may be formed to have a substantially uniform thickness along a profile of the active layer 130. The gate insulation layer 150 may be formed using silicon compound, metal oxide, etc.

A gate insulation pattern 152 may be formed in the peripheral region 20 on the substrate 110 and the active pattern 132. The gate insulation pattern 152 may suitably or sufficiently cover the active pattern 132 on the substrate 110, and may have a substantially level surface without a step around the active pattern 132. In some embodiments, the gate insulation pattern 152 may cover the active pattern 132 on the substrate 110, and may be formed to have a substantially uniform thickness along a profile of the active pattern 132. In example embodiments, the gate insulation pattern 152 and the gate insulation layer 150 may be concurrently (e.g., simultaneously) formed using the same or substantially the same material. In other words, the gate insulation pattern 152 and the gate insulation layer 150 may be formed at the same level. In some example embodiments, the gate insulation layer 150 and the gate insulation pattern 152 may be integrally formed.

Figure 17:
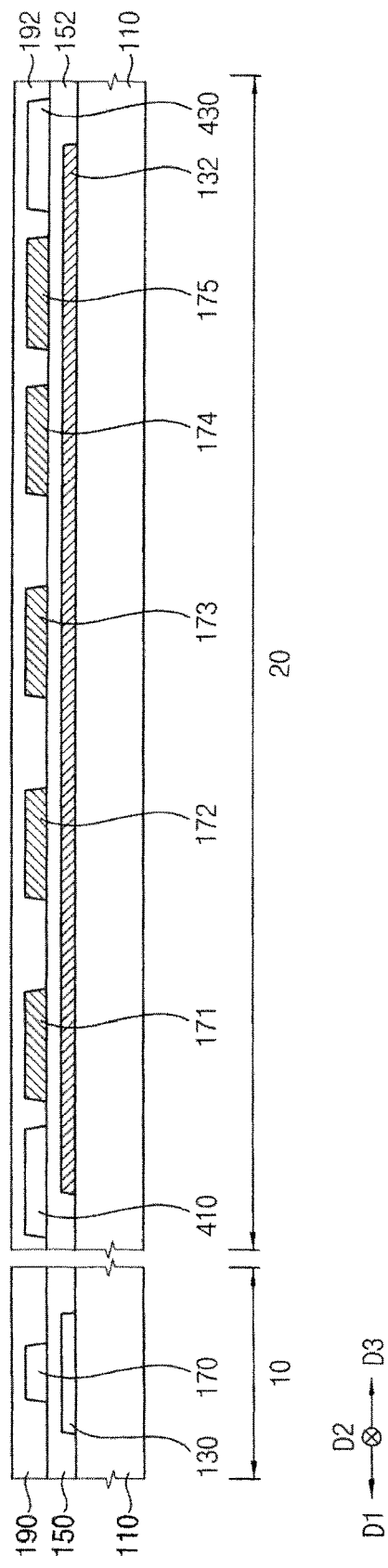

Referring to FIG. 17, a gate electrode 170 may be formed in the pixel region 10 on the gate insulation layer 150. The gate electrode 170 may be formed on a portion of the gate insulation layer 150 under which the active layer 130 is located in the pixel region 10. The gate electrode 170 may be formed using a metal, a metal alloy, metal nitride, conductive metal oxide, transparent conductive materials, etc. For example, the gate electrode 170 may include Au, Ag, Al, Pt, Ni, Ti, Pd, Mg, Ca, Li, Cr, Ta, W, Cu, Mo, Sc, Nd, Ir, an alloy of aluminum, AlNx, an alloy of silver, WNx, an alloy of copper, an alloy of molybdenum, TiNx, CrNx, TaNx, SRO, ZnOx, ITO, SnOx, InOx, GaOx, IZO, etc. These may be used alone or in a suitable combination thereof. In some example embodiments, the gate electrode 170 may have a multi-layered structure.

A first wiring 410, a third wiring 430, a first gate electrode pattern 171, a second gate electrode pattern 172, a third gate electrode pattern 173, a fourth gate electrode pattern 174, and a fifth gate electrode pattern 175 may be formed in the peripheral region 20 on the gate insulation pattern 152.

The first wiring 410 may extend in a second direction D2 that is perpendicular (e.g., substantially perpendicular) to the first and third directions D1 and D3. In addition, the first wiring 410 may have a first width W1 (refer to FIG. 13). In example embodiments, a portion of the first wiring 410 may overlap the first distal end portion 133 of the active pattern 132. The first wiring 410 may include data signal wirings, scan signal wirings, initialization signal wirings, emission signal wirings, power supply voltage wirings, etc. In example embodiments, the first wiring 410 may be a high power supply voltage wiring.

The third wiring 430 may be spaced apart from the first wiring 410 in the third direction D3, and may extend in the second direction D2. In addition, the third wiring 430 may have a third width W3 (refer to FIG. 13). In example embodiments, a portion of the third wiring 430 may overlap the second distal end portion 134 of the active pattern 132. In addition, the first width W1 may be substantially the same as (or identical to) the third width W3. The third wiring 430 may include data signal wirings, scan signal wirings, initialization signal wirings, emission signal wirings, power supply voltage wirings, etc. In example embodiments, the third wiring 430 may be a low power supply voltage wiring. For example, a voltage level of the third wiring 430 may be less than a voltage level of the first wiring 410.

The first gate electrode pattern 171, the second gate electrode pattern 172, the third gate electrode pattern 173, the fourth gate electrode pattern 174, and the fifth gate electrode pattern 175 may be formed to overlap the active pattern 132, and may be spaced apart from each other. For example, the first gate electrode pattern 171 may be formed adjacent to the first wiring 410, and the fifth gate electrode pattern 175 may be formed adjacent to third wiring 430. In addition, the second gate electrode pattern 172, the third gate electrode pattern 173, and the fourth gate electrode pattern 174 may be sequentially formed between the first gate electrode pattern 171 and the fifth gate electrode pattern 175.

In example embodiments, the gate electrode 170, the first wiring 410, the third wiring 430, the first gate electrode pattern 171, the second gate electrode pattern 172, the third gate electrode pattern 173, the fourth gate electrode pattern 174, and the fifth gate electrode pattern 175 may be concurrently (e.g., simultaneously) formed using the same or substantially the same material. For example, the gate electrode 170, the first and third wirings 410 and 430, and the first, second, third, fourth, and fifth gate electrode patterns 171, 172, 173, 174, and 175 may be located at the same level.

An insulating interlayer 190 may be formed in the pixel region 10 on the gate insulation layer 150 and the gate electrode 170. For example, the insulating interlayer 190 may suitably or sufficiently cover the gate electrode 170 on the gate insulation layer 150, and may have a substantially level surface without a step around the gate electrode 170. In some embodiments, the insulating interlayer 190 may cover the gate electrode 170 on the gate insulation layer 150, and may be formed to have a substantially uniform thickness along a profile of the gate electrode 170. The insulating interlayer 190 may be formed using silicon compound, metal oxide, etc.

An insulating interlayer pattern 192 may be formed in the peripheral region 20 on the gate insulation pattern 152, the first and third wirings 410 and 430, and the first, second, third, fourth, and fifth gate electrode patterns 171, 172, 173, 174, and 175. For example, the insulating interlayer pattern 192 may suitably or sufficiently cover the first and third wirings 410 and 430, and the first, second, third, fourth, and fifth gate electrode patterns 171, 172, 173, 174, and 175 on the gate insulation pattern 152, and may have a substantially level surface without a step around the first and third wirings 410 and 430, and the first, second, third, fourth, and fifth gate electrode patterns 171, 172, 173, 174, and 175. In some embodiments, the insulating interlayer pattern 192 may cover the first and third wirings 410 and 430, and the first, second, third, fourth, and fifth gate electrode patterns 171, 172, 173, 174, and 175 on the gate insulation pattern 152, and may be formed to have a substantially uniform thickness along a profile of the first and third wirings 410 and 430, and the first, second, third, fourth, and fifth gate electrode patterns 171, 172, 173, 174, and 175. In example embodiments, the insulating interlayer 190 and the insulating interlayer pattern 192 may be concurrently (e.g., simultaneously) formed using the same or substantially the same material. In other words, the insulating interlayer 190 and the insulating interlayer pattern 192 may be formed at the same level. In some example embodiments, the insulating interlayer 190 and the insulating interlayer pattern 192 may be integrally formed.

Figure 18:
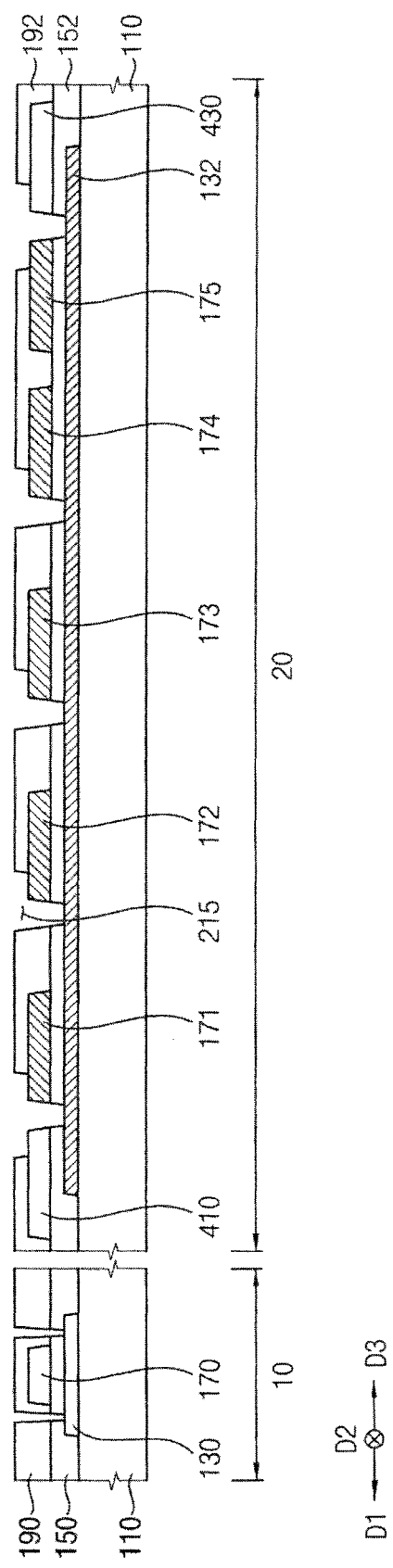

Referring to FIG. 18, in the pixel region 10, a first contact hole formed by removing a first portion of the gate insulation layer 150 and the insulating interlayer 190 each may be formed to overlap the first region (e.g., a source region) of the active layer 130, and a second contact hole formed by removing a second portion of the gate insulation layer 150 and the insulating interlayer 190 each may be formed to overlap the second region (e.g., a drain region) of the active layer 130.

In the peripheral region 20, a contact hole 215 (e.g., third, fourth, fifth, sixth, and seventh contact holes 215 that will be described below) may be formed to overlap a portion of the first region of the active pattern 132 and a portion of a third region of the active pattern 132.

In other words, a third contact hole 215 may be formed to overlap a portion of the first wiring 410, a portion of the active pattern 132 that is located between the first wiring 410 and the first gate electrode pattern 171, and a portion of the first gate electrode pattern 171.

The third contact hole 215 may be formed by removing a portion of the insulating interlayer pattern 192 and the gate insulation pattern 152 each, and a portion of the first wiring 410, a portion of the first gate electrode pattern 171, and a portion of the active pattern 132 that is located between the first wiring 410 and the first gate electrode pattern 171 may be exposed via the third contact hole 215. For example, the third contact hole 215 may concurrently (e.g., simultaneously) expose a portion of an upper surface of the first wiring 410, a portion of a side surface of the first wiring 410, a portion of an upper surface of the first gate electrode pattern 171, a portion of a side surface of the first gate electrode pattern 171, and a portion of an upper surface of the active pattern 132 that is located between the first wiring 410 and the first gate electrode pattern 171.

A fourth contact hole 215 may be formed to overlap a portion of the active pattern 132 that is located between the first and second gate electrode patterns 171 and 172 and a portion of the second gate electrode pattern 172. The fourth contact hole 215 may be formed by removing a portion of the insulating interlayer pattern 192 and the gate insulation pattern 152 each, and a portion of the second gate electrode pattern 172 and a portion of the active pattern 132 that is located between the first gate electrode pattern 171 and the second gate electrode pattern 172 may be exposed via the fourth contact hole 215. For example, the fourth contact hole 215 may concurrently (e.g., simultaneously) expose a portion of an upper surface of the second gate electrode pattern 172, a portion of a side surface of the second gate electrode pattern 172, and a portion of an upper surface of the active pattern 132 that is located between the first gate electrode pattern 171 and the second gate electrode pattern 172.

A fifth contact hole 215 may be formed to overlap a portion of the third gate electrode pattern 173 and a portion of the active pattern 132 that is located between the second gate electrode pattern 172 and the third gate electrode pattern 173. The fifth contact hole 215 may be formed by removing a portion of the insulating interlayer pattern 192 and the gate insulation pattern 152 each, and a portion of the third gate electrode pattern 173 and a portion of the active pattern 132 that is located between the second gate electrode pattern 172 and the third gate electrode pattern 173 may be exposed via the fifth contact hole 215. For example, the fifth contact hole 215 may concurrently (e.g., simultaneously) expose a portion of an upper surface of the third gate electrode pattern 173, a portion of a side surface of the third gate electrode pattern 173, and a portion of an upper surface of the active pattern 132 that is located between the second gate electrode pattern 172 and the third gate electrode pattern 173.

A sixth contact hole 215 may be formed to overlap a portion of the active pattern 132 that is located between the third and fourth gate electrodes patterns 173 and 174 and a portion of the fourth gate electrode pattern 174. The sixth contact hole 215 may be formed by removing a portion of the insulating interlayer pattern 192 and the gate insulation pattern 152 each, and a portion of the fourth gate electrode pattern 174 and a portion of the active pattern 132 that is located between the third and fourth gate electrodes patterns 173 and 174 may be exposed via the sixth contact hole 215. For example, the sixth contact hole 215 may concurrently (e.g., simultaneously) expose a portion of an upper surface of the fourth gate electrode pattern 174, a portion of a side surface of the fourth gate electrode pattern 174, and a portion of an upper surface of the active pattern 132 that is located between the third and fourth gate electrodes patterns 173 and 174.

A seventh contact hole 215 may be formed to overlap a portion of the third wiring 430, a portion of the active pattern 132 that is located between the third wiring 430 and the fifth gate electrode pattern 175, and a portion of the fifth gate electrode pattern 175. The seventh contact hole 215 may be formed by removing a portion of the insulating interlayer pattern 192 and the gate insulation pattern 152 each, and a portion of the third wiring 430, a portion of the fifth gate electrode pattern 175, and a portion of the active pattern 132 that is located between the third wiring 430 and the fifth gate electrode pattern 175 may be exposed via the seventh contact hole 215. For example, the seventh contact hole 215 may concurrently (e.g., simultaneously) expose a portion of an upper surface of the third wiring 430, a portion of a side surface of the third wiring 430, a portion of an upper surface of the fifth gate electrode pattern 175, a portion of a side surface of the fifth gate electrode pattern 175, and a portion of an upper surface of the active pattern 132 that is located between the third wiring 430 and the fifth gate electrode pattern 175.

Figure 19:
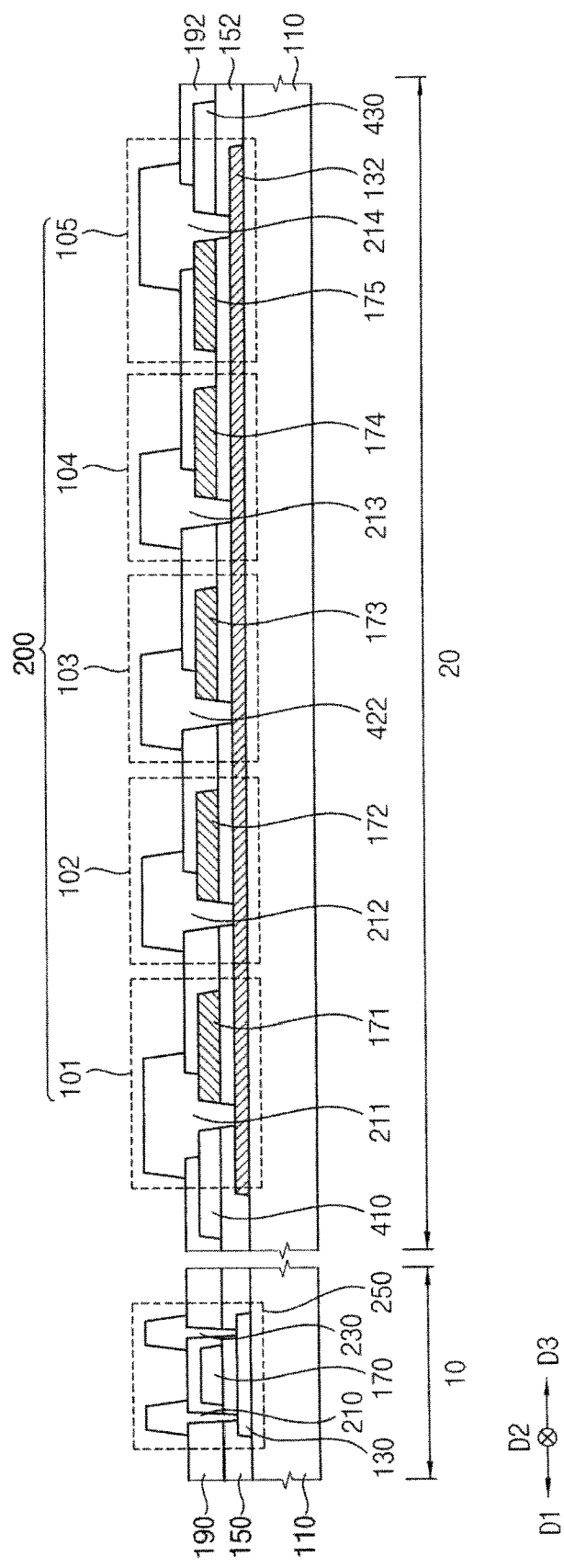
Figure 20:
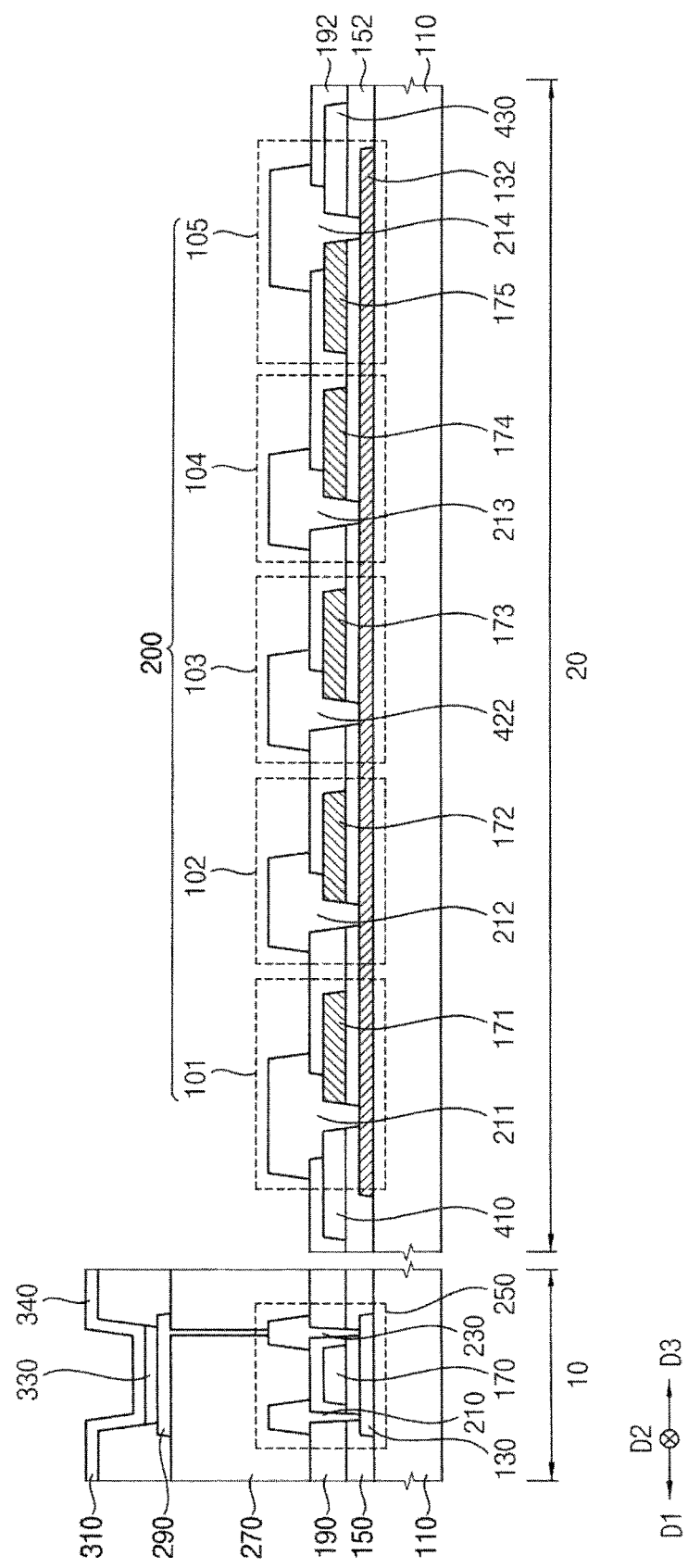

Referring to FIG. 19, a source electrode 210 and a drain electrode 230 may be formed in the pixel region 10 on the insulating interlayer 190. The source electrode 210 may be in direct contact with the first region of the active layer 130 via the first contact hole formed by removing the first portion of the gate insulation layer 150 and the insulating interlayer 190 each. The drain electrode 230 may be in direct contact with a second region of the active layer 130 via the second contact hole formed by removing the second portion of the gate insulation layer 150 and the insulating interlayer 190 each. The source electrode 210 and the drain electrode 230 may be formed using a metal, an alloy, metal nitride, conductive metal oxide, transparent conductive materials, etc.

These may be used alone or in a suitable combination thereof. In some example embodiments, each of the source and drain electrodes 210 and 230 may have a multi-layered structure. Accordingly, a semiconductor element 250 including the active layer 130, the gate insulation layer 150, the gate electrode 170, the insulating interlayer 190, the source electrode 210, and the drain electrode 230 may be formed.

A second extension 422 of a second wiring 420, a first connection pattern 211, a second connection pattern 212, a third connection pattern 213, and a fourth connection pattern 214 may be formed in the peripheral region 20 on the insulating interlayer pattern 192.

The first connection pattern 211, the second connection pattern 212, the third connection pattern 213, and the fourth connection pattern 214 may be formed to overlap the first gate electrode pattern 171, the second gate electrode pattern 172, the fourth gate electrode pattern 174, and the fifth gate electrode pattern 175, respectively.

For example, the first connection pattern 211 may overlap a portion of the first wiring 410, a portion of the active pattern 132 that is located between the first wiring 410 and the first gate electrode pattern 171, and a portion of the first gate electrode pattern 171. Here, the first region of the active pattern 132 may correspond to a portion of the active pattern 132, and the third region of the active pattern 132 may correspond to a portion of the first gate electrode pattern 171. The first connection pattern 211 may be in direct contact with a portion of the first wiring 410, a portion of the first gate electrode pattern 171, and a portion of the active pattern 132 via the third contact hole 215 formed by removing a portion of the insulating interlayer pattern 192 and the gate insulation pattern 152 each. For example, the first connection pattern 211 may be in concurrent (e.g., simultaneous) contact with a portion of an upper surface of the first wiring 410, a portion of a side surface of the first wiring 410, a portion of an upper surface of the first gate electrode pattern 171, a portion of a side surface of the first gate electrode pattern 171, and a portion of an upper surface of the active pattern 132. In some embodiments, the first connection pattern 211 may be in concurrent (e.g., simultaneous) contact with the first wiring 410, the first gate electrode pattern 171, and the active pattern 132 via the third contact hole 215, and may be electrically coupled to (e.g., electrically connected to) the first wiring 410, the second gate electrode pattern 172, and the active pattern 132.

The second connection pattern 212 may overlap a portion of the active pattern 132 that is located between the first and second gate electrode patterns 171 and 172 and a portion of the second gate electrode pattern 172. Here, the first region of the active pattern 132 may correspond to a portion of the active pattern 132, and the third region of the active pattern 132 may correspond to a portion of the second gate electrode pattern 172. The second connection pattern 212 may be in direct contact with a portion of the second gate electrode pattern 172 and a portion of the active pattern 132 via the fourth contact hole 215 formed by removing a portion of the insulating interlayer pattern 192 and the gate insulation pattern 152 each. For example, the second connection pattern 212 may be in concurrent (e.g., simultaneous) contact with a portion of an upper surface of the second gate electrode pattern 172, a portion of a side surface of the second gate electrode pattern 172, and a portion of an upper surface of the active pattern 132. In some embodiments, the second connection pattern 212 may be in concurrent (e.g., simultaneous) contact with the second gate electrode pattern 172 and the active pattern 132 via the forth contact hole 215, and may be electrically coupled to (e.g., electrically connected to) the second gate electrode pattern 172 and the active pattern 132.

The third connection pattern 213 may overlap a portion of the active pattern 132 that is located between the third and fourth gate electrodes patterns 173 and 174 and a portion of the fourth gate electrode pattern 174. Here, the first region of the active pattern 132 may correspond to a portion of the active pattern 132, and the third region of the active pattern 132 may correspond to a portion of the fourth gate electrode pattern 174. The third connection pattern 213 may be in direct contact with a portion of the fourth gate electrode pattern 174 and a portion of the active pattern 132 via the sixth contact hole 215 formed by removing a portion of the insulating interlayer pattern 192 and the gate insulation pattern 152 each. For example, the third connection pattern 213 may be in concurrent (e.g., simultaneous) contact with a portion of an upper surface of the fourth gate electrode pattern 174, a portion of a side surface of the fourth gate electrode pattern 174, and a portion of an upper surface of the active pattern 132. In some embodiments, the third connection pattern 213 may be in concurrent (e.g., simultaneous) contact with the fourth gate electrode pattern 174 and the active pattern 132 via the sixth contact hole 215, and may be electrically coupled to (e.g., electrically connected to) the fourth gate electrode pattern 174 and the active pattern 132.

The fourth connection pattern 214 may overlap a portion of the third wiring 430, a portion of the active pattern 132 that is located between the third wiring 430 and the fifth gate electrode pattern 175, and a portion of the fifth gate electrode pattern 175. Here, the first region of the active pattern 132 may correspond to a portion of the active pattern 132, and the third region may correspond to a portion of the fifth gate electrode pattern 175. The fourth connection pattern 214 may be in direct contact with a portion of the third wiring 430, a portion of the fifth gate electrode pattern 175, and a portion of the active pattern 132 via the seventh contact hole 215 formed by removing a portion of the insulating interlayer pattern 192 and the gate insulation pattern 152 each. For example, the fourth connection pattern 214 may be in concurrent (e.g., simultaneous) contact with a portion of an upper surface of the third wiring 430, a portion of a side surface of the third wiring 430, a portion of an upper surface of the fifth gate electrode pattern 175, a portion of a side surface of the fifth gate electrode pattern 175, and a portion of an upper surface of the active pattern 132. For example, the fourth connection pattern 214 may be in concurrent (e.g., simultaneous) contact with the third wiring 430, the fifth gate electrode pattern 175, and the active pattern 132 via the seventh contact hole 215, and may be electrically coupled to (e.g., electrically connected to) the third wiring 430, the fifth gate electrode pattern 175, and the active pattern 132.

The second wiring 420 may be intersected with the first wiring 410 and/or the third wiring 430, and may be spaced apart from the active pattern 132 (refer to FIG. 13). The second wiring 420 may have a second width W2 that is less than the first and third widths W1 and W3. In example embodiments, the second wiring 420 may have a first extension 421 and the second extension 422. The first extension 421 may extend in the first direction D1, and the second extension 422 may be protruded in the second direction D2 from the first extension 421. The second extension 422 may be interposed between the second connection pattern 212 and the third connection pattern 213. In addition, the second extension 422 may overlap a portion of the third gate electrode pattern 173 and a portion of the active pattern 132 that is located between the second gate electrode pattern 172 and the third gate electrode pattern 173. Here, the first region of the active pattern 132 may correspond to a portion of the active pattern 132, and the third region of the active pattern 132 may correspond to a portion of the third gate electrode pattern 173.

The second extension 422 may be in direct contact with a portion of the third gate electrode pattern 173 and a portion of the active pattern 132 via the fifth contact hole 215 formed by removing a portion of the insulating interlayer pattern 192 and the gate insulation pattern 152 each. For example, the second extension 422 may be in concurrent (e.g., simultaneous) contact with a portion of an upper surface of the third gate electrode pattern 173, a portion of a side surface of the third gate electrode pattern 173, and a portion of an upper surface of the active pattern 132. In some embodiments, the second extension 422 may be in concurrent (e.g., simultaneous) contact with the third gate electrode pattern 173 and the active pattern 132 via the fifth contact hole 215, and may be electrically coupled to (e.g., electrically connected to) the third gate electrode pattern 173 and the active pattern 132. For example, the second extension 422 may serve as a connection pattern of a third electrostatic protection diode 103.

The second wiring 420 may include scan signal wirings, data signal wirings, initialization signal wirings, or emission signal wirings. In example embodiments, the second wiring 420 may include the scan signal wiring, initialization signal wirings, or emission signal wirings.

Accordingly, a first electrostatic protection diode 101 constituting the active pattern 132, the first gate electrode pattern 171, and the first connection pattern 211, the second electrostatic protection diode 102 constituting the active pattern 132, a second gate electrode pattern 172, and the second connection pattern 212, the third electrostatic protection diode 103 constituting the active pattern 132, the third gate electrode pattern 173, and the second extension 422, a fourth electrostatic protection diode 104 constituting the active pattern 132, the fourth gate electrode pattern 174, and the third connection pattern 213, and a fifth electrostatic protection diode 105 constituting the active pattern 132, the fifth gate electrode pattern 175, and the fourth connection pattern 214 may be formed. For example, the electrostatic protection structure 200 may be formed. In some embodiments, an electrostatic protection structure 200 may be formed.

A planarization layer 270 may be formed in pixel region 10 on the insulating interlayer 190, the source electrode 210 and the drain electrode 230. For example, the planarization layer 270 may be formed as a high thickness to suitably or sufficiently cover the insulating interlayer 190 and the source and drain electrodes 210 and 230. In this case, the planarization layer 270 may have a substantially flat upper surface, and a planarization process may be further performed on the planarization layer 270 to implement the flat upper surface of the planarization layer 270. In some embodiments, the planarization layer 270 may cover the insulating interlayer 190 and the source and drain electrodes 210 and 230, and may be formed to have a substantially uniform thickness along a profile of the insulating interlayer 190 and the source and drain electrodes 210 and 230. The planarization layer 270 may include organic materials and/or inorganic materials. In example embodiments, the planarization layer 270 may be formed using organic materials. In some example embodiments, the planarization layer 270 may be formed in the peripheral region 20 on the electrostatic protection structure 200.

A lower electrode 290 may be formed in the pixel region 10 on the planarization layer 270. The lower electrode 290 may be in contact with the drain electrode 230 via a contact hole formed by removing a portion of the planarization layer 270. In addition, the lower electrode 290 may be electrically coupled to (e.g., electrically connected to) the semiconductor element 250. For example, the lower electrode 290 may be formed using a metal, a metal alloy, metal nitride, conductive metal oxide, transparent conductive materials, etc. These may be used alone or in a suitable combination thereof. In some embodiments, the lower electrode 290 may have a multi-layered structure.

A pixel defining layer 310 may be formed in the pixel region 10 on the planarization layer 270, and may cover both lateral portions of the lower electrode 290. The pixel defining layer 310 may include organic materials and/or inorganic materials. In example embodiments, the pixel defining layer 310 may be formed using organic materials.

A light emitting layer 330 may be formed in a portion where an upper surface of the lower electrode 290 is exposed by the pixel defining layer 310. The light emitting layer 330 may be formed using at least one of light emitting materials capable of generating different colors of light (e.g., a red color of light, a blue color of light, and a green color of light) according to sub-pixels. In some embodiments, the light emitting layer 330 may generally generate a white color of light by stacking a plurality of light emitting materials capable of generating different colors of light such as a red color of light, a green color of light, and a blue color of light. In this case, a color filter may be formed on the light emitting layer 330. The color filter may include at least one selected from a red color filter, a green color filter, and a blue color filter. In some embodiments, the color filter may include a yellow color filter, a cyan color filter, and a magenta color filter. The color filter may be formed using a photosensitive resin or a color photoresist.

An upper electrode 340 may be formed in the pixel region 10 on the pixel defining layer 310 and the light emitting layer 330. The upper electrode 340 may be formed using a metal, a metal alloy, metal nitride, conductive metal oxide, transparent conductive materials, etc. These may be used alone or in a suitable combination thereof. Accordingly, the pixel structure 400 including the semiconductor element 250, the planarization layer 270, the lower electrode 290, the pixel defining layer 310, the light emitting layer 330, and the upper electrode 340 may be formed.

An encapsulation substrate may be formed on the upper electrode 340. The encapsulation substrate and the substrate 110 may include substantially the same material. For example, the encapsulation substrate may be formed using a quartz substrate, a synthetic quartz substrate, a calcium fluoride substrate, a fluoride-doped quartz substrate, a sodalime glass substrate, a non-alkali glass substrate, etc. In some example embodiments, the encapsulation substrate may include a transparent inorganic material or flexible plastic. For example, the encapsulation substrate may be formed using flexible transparent resin substrate. In this case, to increase flexibility of the OLED device, the encapsulation substrate may include a stacked structure where at least one inorganic layer and at least one organic layer are alternately stacked. Accordingly, an OLED device 500 illustrated in FIGS. 14-15 may be manufactured.

In a method of manufacturing of the OLED device 500 including the electrostatic protection structure 200 according to example embodiments, since the number of the contact holes 215 is relatively decreased, a manufacturing cost of the OLED device 500 including the electrostatic protection structure 200 may be reduced.

Embodiments of the present disclosure may be applied to various suitable display devices such as, for example, an organic light emitting display device. For example, embodiments of the present disclosure may be applied to vehicle-display device, a ship-display device, an aircraft-display device, portable communication devices, display devices for display or for information transfer, a medical-display device, etc.

The foregoing is illustrative of example embodiments and is not to be construed as limiting thereof. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, descriptions thereof will not be repeated. In the drawings, the relative sizes of elements, layers, and regions may be exaggerated for clarity.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, acts, operations, elements, and/or components, but do not preclude the presence or addition of one or more other features, integers, acts, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the terms "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

Also, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

Although example embodiments have been described herein, those skilled in the art will readily appreciate that many modifications are possible in the example embodiments without materially departing from the spirit and scope of the present disclosure. Accordingly, all such modifications are intended to be included within the spirit and scope of the present disclosure as defined in the appended claims, and equivalents thereof. Therefore, it is to be understood that the foregoing is illustrative of various example embodiments and is not to be construed as limited to the specific example embodiments disclosed, and that modifications to the disclosed example embodiments, as well as other example embodiments, are intended to be included within the spirit and scope of the appended claims, and equivalents thereof.

What is claimed is:

1. An organic light emitting display (OLED) device, comprising:
    a substrate comprising a pixel region comprising a plurality of pixel structures and a peripheral region comprising a plurality of wirings, the wirings being electrically coupled to the pixel structures, the peripheral region surrounding the pixel region;
    a first wiring in the peripheral region on the substrate, the first wiring having a first width;
    a second wiring on the first wiring, the second wiring intersecting the first wiring, the second wiring having a second width that is less than the first width;
    a third wiring spaced apart from the first wiring, the third wiring having a third width that is greater than the second width; and
    an electrostatic protection structure having electrostatic protection diodes, the electrostatic protection diodes being electrically coupled to the first, second, and third wirings, the electrostatic protection diodes each comprising:
    an active pattern in the peripheral region on the substrate, the active pattern having a first region, a second region spaced apart from the first region, and a third region located between the first and second regions;
    a gate electrode pattern in the third region on the active pattern; and
    a connection pattern on the gate electrode pattern, the connection pattern overlapping a portion of the first region of the active pattern and a portion of the third region, the connection pattern being electrically coupled to the gate electrode pattern and the active pattern.

2. The OLED device of claim 1, wherein the active patterns extend in a first direction parallel to an upper surface of the substrate, and comprises a first distal end portion and a second distal end portion,
    wherein a first distal end portion of the active patterns overlaps a portion of the first wiring, and
    wherein a second distal portion of the active patterns overlaps a portion of the third wiring, and the second distal portion is opposite to the first distal end portion.

3. The OLED device of claim 2, wherein the first wiring and the third wiring extend in a second direction perpendicular to first direction, and
    wherein the second wiring is spaced apart from the active patterns, and extends in the first direction.

4. The OLED device of claim 3, wherein the gate electrode patterns comprise first, second, third, fourth, and fifth gate electrode patterns on the active patterns, and
    wherein the first, second, third, fourth, and fifth gate electrode patterns overlap the active patterns, and are spaced apart from each other.

5. The OLED device of claim 4, wherein the first gate electrode pattern is adjacent to the first wiring, and fifth gate electrode pattern is adjacent to the third wiring, and wherein the second, third, and fourth gate electrode patterns are sequentially located between first and fifth gate electrode patterns.

6. The OLED device of claim 4, wherein the connection-patterns comprise first, second, third, and fourth connection patterns on the first, second, fourth, and fifth gate electrode patterns, and
    wherein the first, second, third, and fourth connection patterns overlap the first, second, fourth, and fifth gate electrode patterns, respectively, and are spaced apart from each other.

7. The OLED device of claim 6, wherein the first connection pattern overlaps a portion of the first wiring, a portion of the active patterns, and a portion of the first gate electrode pattern, and the fourth connection pattern overlaps a portion of the third wiring, a portion of the active patterns, and a portion of the fifth gate electrode pattern, and
    wherein the second connection pattern overlaps a portion of the active patterns and a portion of the second gate electrode pattern, and the third connection pattern overlaps a portion of the active patterns and a portion of the fourth gate electrode pattern.

8. The OLED device of claim 6, wherein the second wiring comprises:
    a first extension extending in the first direction; and
    a second extension protruding in the second direction from the first extension.

9. The OLED device of claim 8, wherein the second extension is located at the same level with the first, second, third, and fourth connection patterns, and is interposed between the second and third connection patterns.

10. The OLED device of claim 8, wherein the second extension overlaps a portion of the third gate electrode pattern and a portion of the active patterns.

11. The OLED device of claim 1, wherein the first wiring is a high power supply voltage wiring, and the third wiring is a lower power supply voltage wiring, and
    wherein the second wiring is a scan signal wiring, a data signal wiring, an initialization signal wiring, or an emission signal wiring.

12. The OLED device of claim 1, wherein the first thickness is the same as the third thickness.

13. The OLED device of claim 1, wherein the first wiring, the third wiring, the gate electrode patterns are concurrently formed using the same material, and the second wiring and the connection patterns are concurrently formed using the same material.

14. The OLED device of claim 1, wherein each of the pixel structures comprises:
    a semiconductor element in the pixel region on the substrate;
    a lower electrode on the semiconductor element;
    a light emitting layer on the lower electrode; and
    an upper electrode on the light emitting layer.

15. The OLED device of claim 14, wherein the semiconductor element comprises:
    an active layer in the pixel region on the substrate;
    a gate insulation layer covering the active layer;
    a gate electrode on the gate insulation layer;
    an insulating interlayer covering the gate electrode; and
    source and drain electrodes on the insulating interlayer.

16. The OLED device of claim 15, further comprising:
    a gate insulation pattern covering the active patterns; and
    an insulating interlayer pattern on the gate insulation pattern and the gate electrode pattern, the insulating interlayer pattern covering the gate electrode patterns.

17. The OLED device of claim 16, wherein the active layer and the active patterns are concurrently formed using the same material, and the gate insulation layer and the gate insulation pattern are concurrently formed using the same material,
- wherein the gate electrode and the gate electrode patterns are concurrently formed using the same material, and the insulating interlayer and the insulating interlayer pattern are concurrently formed using the same material, and
- wherein the source and drain electrodes and the connection patterns are concurrently formed using the same material.

* * * * *